(12) United States Patent
Kurosawa

(10) Patent No.: US 12,413,220 B2
(45) Date of Patent: Sep. 9, 2025

(54) DRIVE CIRCUIT OF SWITCHING ELEMENT AND INTELLIGENT POWER MODULE

(71) Applicant: FUJI ELECTRIC CO., LTD., Kawasaki (JP)

(72) Inventor: Eiji Kurosawa, Nagano (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 177 days.

(21) Appl. No.: 18/190,522

(22) Filed: Mar. 27, 2023

(65) Prior Publication Data
US 2023/0387904 A1    Nov. 30, 2023

(30) Foreign Application Priority Data
May 30, 2022    (JP) ................. 2022-087586

(51) Int. Cl.
H03K 17/082    (2006.01)
H03K 17/0812    (2006.01)
H02P 27/06    (2006.01)
H03K 17/08    (2006.01)

(52) U.S. Cl.
CPC ...... *H03K 17/08128* (2013.01); *H02P 27/06* (2013.01); *H03K 2017/0806* (2013.01)

(58) Field of Classification Search
CPC ...... H03K 17/00; H03K 17/08; H03K 17/082; H03K 17/30; H03K 17/302; H03K 17/567; H03K 17/687; H03K 2017/0806

USPC ................. 327/108, 109, 389, 411
See application file for complete search history.

(56) References Cited

U.S. PATENT DOCUMENTS 9,590,612 B2    3/2017 Mori
12,021,511 B2 *    6/2024 Fujii ............... H03K 17/567
2016/0301406 A1    10/2016 Mori

FOREIGN PATENT DOCUMENTS

JP    2018-143017 A    9/2018
WO    2016/009582 A1    1/2016

* cited by examiner

*Primary Examiner* — Hai L Nguyen

(57) ABSTRACT

A gate drive circuit, in order to cause an IGBT in a semiconductor elements to switch to the ON state according to the signal level of an input signal, includes a constant current supply unit configured to supply constant current to the gate of the IGBT, a switching signal input terminal to which a switching signal is input, a signal level determination unit configured to determine a signal level of the switching signal, and a drive capability switching unit configured to, by changing a current amount of constant current output from the constant current supply unit, based on a determination result in the signal level determination unit and a signal level of the input signal, switch the drive capability of the constant current supply unit.

8 Claims, 3 Drawing Sheets

DRIVE CIRCUIT OF SWITCHING ELEMENT AND INTELLIGENT POWER MODULE

CROSS REFERENCE TO RELATED APPLICATION

This application claims the priority benefit of Japanese Patent Application No. JP2022-087586 filed on May 30, 2022, the contents of which are incorporated herein by reference.

TECHNICAL FIELD

The present invention relates to a drive circuit of a switching element that drives the switching element and an intelligent power module including the drive circuit.

BACKGROUND ART

PTL 1 discloses a drive circuit of a voltage control-type device in which turn-on capability of the drive circuit can be adjusted in accordance with specifications or the like of at least one of the voltage control-type device. PTL 2 discloses a programmable drive control circuit in which drive capability of a pre-driver to drive a transistor performing switching operation can be adjusted by software.

CITATION LIST

Patent Literature

PTL 1: WO 2016/9582 A
PTL 2: JP 2018-143017 A

SUMMARY OF INVENTION

Technical Problem

Intelligent power modules that integrate a semiconductor chip including an insulated gate bipolar transistor (IGBT) for power conversion and a freewheel diode and an IC for drive and protection function into a package have been known. In such an intelligent power module (IPM), drive capability of a drive circuit to drive an IGBT for power conversion is fixed. Thus, when a signal to bring an IGBT into the ON state is input to the IPM, a metal-oxide-semiconductor (MOS) transistor arranged in the IPM to drive the IGBT operates. The operation of the MOS transistor causes current of a constant current amount to be supplied from the MOS transistor the drive capability of which is fixed to the IGBT, and the IGBT switches from the OFF state to the ON state.

As described above, in the IPM, current supplied from the MOS transistor to the IGBT is fixed to a constant current value, that is, drive capability to drive the IGBT is fixed. Thus, a conventional IPM causes a problem to arise in that, when the drive capability of an IGBT arranged in the IPM is excessively high or insufficient for an object to be driven, such as a motor, an IPM is required to be newly developed.

An object of the present invention is to provide a drive circuit of a switching element and an intelligent power module capable of selecting a drive capability to drive the switching element in a simple method.

Solution to Problem

In order to achieve the above-described object, a drive circuit of a switching element according to one aspect of the present invention, in order to cause a switching element to switch to the ON state according to a signal level of an input signal input from the outside, includes a constant current supply unit configured to supply constant current to a control signal input terminal of the switching element, a switching signal input terminal to which a switching signal to switch drive capability of the constant current supply unit causing the switching element to operate is input, a signal level determination unit configured to determine a signal level of the switching signal, and a drive capability switching unit configured to, by changing a current amount of the constant current, based on a determination result in the signal level determination unit and a signal level of the input signal, switch the drive capability.

In addition, in order to achieve the above-described object, an intelligent power module according to another aspect of the present invention includes a switching element and the drive circuit of the switching element according to the above-described one aspect of the present invention.

Advantageous Effects of Invention

One aspect of the present invention allows a drive capability to drive a switching element to be selected in a simple method.

DESCRIPTION OF EMBODIMENTS

The embodiments of the present invention indicate devices and methods to embody the technical idea of the present invention by way of example, and the technical idea of the present invention does not limit the materials, shapes, structures, arrangements, and the like of the constituent components to those described below. The technical idea of the present invention can be subjected to a variety of alterations within the technical scope prescribed by the claims described in CLAIMS.

Although the following description of intelligent power modules according to the respective embodiments will be made below using an inverter device as an example, the intelligent power modules according to the respective embodiments are applicable to not only an inverter device but also a converter device and a modular multilevel converter.

First Embodiment

Figure 1:
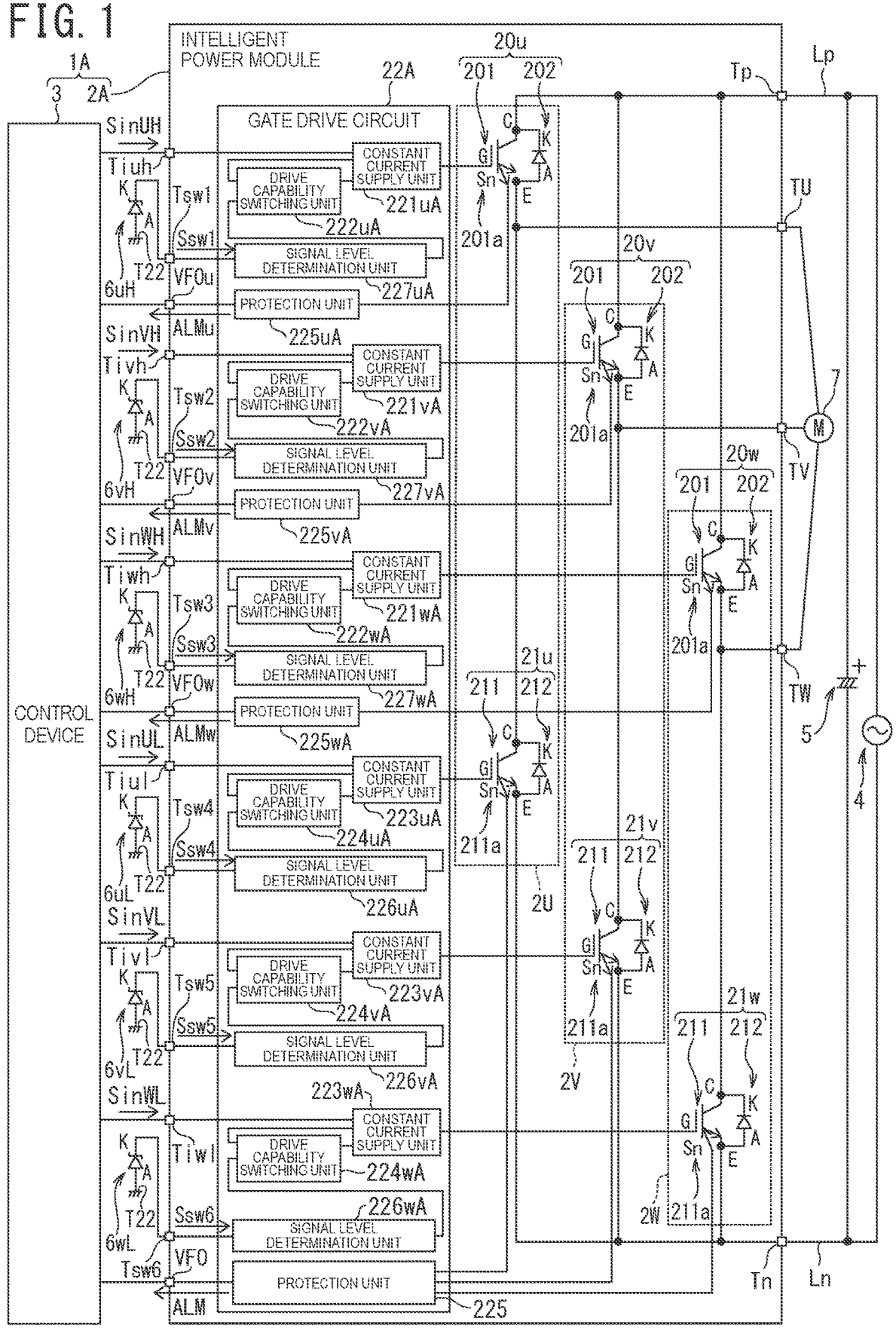
FIG. 1 is a block diagram illustrating an example of a schematic configuration of a power conversion device including an intelligent power module according to a first embodiment of the present invention.

A drive circuit of a switching element and an intelligent power module according to a first embodiment of the present invention will be described using FIGS. 1 and 2. First, an example of an overall configuration of an intelligent power module 2A according to the present embodiment will be described using FIG. 1. FIG. 1 is a block diagram illustrating an example of a schematic configuration of the intelligent power module 2A according to the present embodiment.
(Overall Configuration of Intelligent Power Module)

As illustrated in FIG. 1, a power conversion device 1A that includes the intelligent power module 2A according to the present embodiment is connected to an AC power unit 4. The AC power unit 4 includes, for example, a three-phase AC power supply (not shown) and a rectifier circuit (not shown) configured to full-wave rectify three-phase AC power input from the three-phase AC power supply. The power conversion device 1A includes a smoothing capacitor 5 configured to smooth power rectified by the rectifier circuit. Although illustration is omitted, the rectifier circuit is, for example, configured by connecting six diodes in a full bridge configuration or connecting six switching elements in a full bridge configuration.

A positive electrode-side line Lp is connected to the positive electrode side of the AC power unit 4 (i.e., a positive electrode output terminal of the rectifier circuit), and a negative electrode-side line Ln is connected to the negative electrode side of the AC power unit 4 (i.e., a negative electrode output terminal of the rectifier circuit). The smoothing capacitor 5 is connected between the positive electrode-side line Lp and the negative electrode-side line Ln. The power conversion device 1A includes the intelligent power module 2A configured to function as an inverter device that converts DC voltage applied between the positive electrode-side line Lp and the negative electrode-side line Ln to three-phase (a U phase, a V phase, and a W phase) AC power and a control device 3 configured to control the intelligent power module 2A.

As illustrated in FIG. 1, the intelligent power module 2A has a positive electrode-side power input terminal Tp to which the positive electrode-side line Lp is connected and a negative electrode-side power input terminal Tn that is connected to the negative electrode-side line Ln. The intelligent power module 2A includes a semiconductor element 20u and a semiconductor element 21u that are connected in series between the positive electrode-side power input terminal Tp and the negative electrode-side power input terminal Tn. The intelligent power module 2A includes a semiconductor element 20v and a semiconductor element 21v that are connected in series between the positive electrode-side power input terminal Tp and the negative electrode-side power input terminal Tn. The intelligent power module 2A includes a semiconductor element 20w and a semiconductor element 21w that are connected in series between the positive electrode-side power input terminal Tp and the negative electrode-side power input terminal Tn.

The semiconductor element 20u and the semiconductor element 21u constitute a U-phase output arm 2U. The semiconductor element 20v and the semiconductor element 21v constitute a V-phase output arm 2V. The semiconductor element 20w and the semiconductor element 21w constitute a W-phase output arm 2W. The semiconductor elements 20u, 20v, and 20w are connected to the positive electrode-side line Lp via the positive electrode-side power input terminal Tp and constitute an upper arm portion. The semiconductor elements 21u, 21v, and 21w are connected to the negative electrode-side line Ln via the negative electrode-side power input terminal Tn and constitute a lower arm portion.

Each of the semiconductor elements 20u, 20v, and 20w includes an IGBT chip 201 and a freewheel diode 202 connected in inverse parallel to an IGBT 201a that is arranged in the IGBT chip 201. An IGBT 201a and a freewheel diode 202 that are arranged in the semiconductor element 20u may be formed in an identical semiconductor chip. An IGBT 201a and a freewheel diode 202 that are arranged in the semiconductor element 20v may be formed in an identical semiconductor chip. An IGBT 201a and a freewheel diode 202 that are arranged in the semiconductor element 20w may be formed in an identical semiconductor chip. The IGBTs 201a and the freewheel diodes 202 that are respectively arranged in the semiconductor elements 20u, 20v, and 20w are formed in semiconductor chips that are different from one another. Although details will be described later, an IGBT chip 201 arranged in each of the semiconductor elements 20u, 20v, and 20w includes a temperature detection element (not shown in FIG. 1) configured to detect temperature of the IGBT 201a.

The collector C of an IGBT 201a and the cathode K of a freewheel diode 202 that are arranged in each of the semiconductor elements 20u, 20v, and 20w are connected to each other and connected to the positive electrode-side power input terminal Tp. The emitter E of an IGBT 201a and the anode A of a freewheel diode 202 that are arranged in each of the semiconductor elements 20u, 20v, and 20w are connected to each other. An IGBT 201a arranged in each of the semiconductor elements 20u, 20v, and 20w has a current detection terminal Sn for detecting current that flows through the IGBT 201a (details will be described later).

Each of the semiconductor elements 21u, 21v, and 21w includes an IGBT chip 211 and a freewheel diode 212 connected in inverse parallel to an IGBT 211a that is arranged in the IGBT chip 211. An IGBT 211a and a freewheel diode 212 that are arranged in the semiconductor element 21u may be formed in an identical semiconductor chip. An IGBT 211a and a freewheel diode 212 that are arranged in the semiconductor element 21v may be formed in an identical semiconductor chip. An IGBT 211a and a freewheel diode 212 that are arranged in the semiconductor element 21w may be formed in an identical semiconductor chip. The IGBTs 211a and the freewheel diodes 212 that are respectively arranged in the semiconductor elements 21u, 21v, and 21w are formed in semiconductor chips that are different from one another. Although details will be described later, an IGBT chip 211 arranged in each of the semiconductor elements 21u, 21v, and 21w includes a temperature detection element (not shown in FIG. 1) configured to detect temperature of the IGBT 211a.

The collector C of an IGBT 211a and the cathode K of a freewheel diode 212 that are arranged in each of the semiconductor elements 21u, 21v, and 21w are connected to each other. The collector C of the IGBT 211a and the cathode K of the freewheel diode 212 that are arranged in the semiconductor element 21u are connected to the emitter E of the IGBT 201a and the anode A of the freewheel diode 202 that are arranged in the semiconductor element 20u. The collector C of the IGBT 211a and the cathode K of the freewheel diode 212 that are arranged in the semiconductor element 21v are connected to the emitter E of the IGBT 201a and the anode A of the freewheel diode 202 that are arranged in the semiconductor element 20v. The collector C of the IGBT 211a and the cathode K of the freewheel diode 212 that are arranged in the semiconductor element 21w are connected to the emitter E of the IGBT 201a and the anode A of the freewheel diode 202 that are arranged in the semiconductor element 20w. The emitter E of an IGBT 211a and the anode A of a freewheel diode 212 that are arranged in each of the semiconductor elements 21u, 21v, and 21w are connected to each other and connected to the negative electrode-side power input terminal Tn. An IGBT 211a arranged in each of the semiconductor elements 21u, 21v, and 21w has a current detection terminal Sn for detecting current that flows through the IGBT 211*a* (details will be described later).

The emitter E of the IGBT and the anode A of the freewheel diode 202 that are arranged in the semiconductor element 20*u* and the collector C of the IGBT and the cathode K of the freewheel diode 212 that are arranged in the semiconductor element 21*u* are connected to a U-phase output terminal TU. The U-phase output terminal TU is a terminal to which U-phase AC voltage that the intelligent power module 2A generated by DC-AC converting the DC voltage input from the AC power unit 4 is output.

The emitter E of the IGBT and the anode A of the freewheel diode 202 that are arranged in the semiconductor element 20*v* and the collector C of the IGBT and the cathode K of the freewheel diode 212 that are arranged in the semiconductor element 21*v* are connected to a V-phase output terminal TV. The V-phase output terminal TV is a terminal to which V-phase AC voltage that the intelligent power module 2A generated by DC-AC converting the DC voltage input from the AC power unit 4 is output.

The emitter E of the IGBT and the anode A of the freewheel diode 202 that are arranged in the semiconductor element 20*w* and the collector C of the IGBT and the cathode K of the freewheel diode 212 that are arranged in the semiconductor element 21*w* are connected to a W-phase output terminal TW. The W-phase output terminal TW is a terminal to which W-phase AC voltage that the intelligent power module 2A generated by DC-AC converting the DC voltage input from the AC power unit 4 is output.

As illustrated in FIG. 1, for example, a motor 7 that serves as a load is connected to the U-phase output terminal TU, the V-phase output terminal TV, and the W-phase output terminal TW that are arranged in the intelligent power module 2A. Thus, the emitters E of the IGBTs 201*a* and the anodes A of the freewheel diodes 202 that are respectively arranged in the semiconductor elements 20*u*, 20*v*, and 20*w* and the collectors C of the IGBTs 211*a* and the cathodes K of the freewheel diodes 212 that are respectively arranged in the semiconductor elements 21*u*, 21*v*, and 21*w* are connected to the motor 7.

As illustrated in FIG. 1, the intelligent power module 2A includes a gate drive circuit 22A configured to drive the semiconductor elements 20*u*, 20*v*, 20*w*, 21*u*, 21*v*, and 21*w*. Each of the IGBTs 201*a* that are respectively arranged in the semiconductor elements 20*u*, 20*v*, and 20*w* and the IGBTs 211*a* that are respectively arranged in the semiconductor elements 21*u*, 21*v*, and 21*w* is equivalent to an example of the switching element. In addition, the gate drive circuit 22A is equivalent to an example of the drive circuit of the switching element according to the present embodiment. Therefore, the intelligent power module 2A includes the IGBTs (an example of the switching element) 201*a* and 211*a* and the gate drive circuit 22A (an example of the drive circuit of the switching element according to the present embodiment).

As illustrated in FIG. 1, in order to cause the IGBT 201*a* of the semiconductor element 20*u* to switch to the ON state according to a signal level of an input signal SinUH input from the control device (an example of the outside) 3 (details will be described later), the gate drive circuit 22A includes a constant current supply unit 221*u*A configured to supply constant current to the gate (an example of a control signal input terminal) G of the IGBT 201*a*. The gate drive circuit 22A has a signal input terminal Tiuh to which the input signal SinUH that the control device 3 outputs is input. The constant current supply unit 221*u*A is connected to the signal input terminal Tiuh. This configuration allows the input signal SinUH to be input to the constant current supply unit 221*u*A.

The gate drive circuit 22A has a switching signal input terminal Tsw1 to which a switching signal Ssw1 to switch drive capability of the constant current supply unit 221*u*A, which drives the IGBT 201*a* arranged in the semiconductor element 20*u*, is input. To the switching signal input terminal Tsw1, a Zener diode 6*u*H that generates the switching signal Ssw1 and also determines a signal level of the switching signal Ssw1 is connected. The Zener diode 6*u*H is connected between the switching signal input terminal Tsw1 and a reference potential terminal T22 (for example, a ground terminal). The cathode K of the Zener diode 6*u*H is connected to the switching signal input terminal Tsw1, and the anode A of the Zener diode 6*u*H is connected to the reference potential terminal T22.

The gate drive circuit 22A includes a signal level determination unit 227*u*A configured to determine a signal level of the switching signal Ssw1. The gate drive circuit 22A includes a drive capability switching unit 222*u*A configured to change a current amount of constant current output from the constant current supply unit 221*u*A, based on a determination result in the signal level determination unit 227*u*A and a signal level of the input signal SinUH and thereby switch the drive capability of the constant current supply unit 221*u*A. An output terminal of the signal level determination unit 227*u*A is connected to an input terminal of the drive capability switching unit 222*u*A. By way of this, an output signal including information about a determination result in which a signal level of the switching signal Ssw1 input from the switching signal input terminal Tsw1 is determined in the signal level determination unit 227*u*A can be input to the drive capability switching unit 222*u*A.

In order to cause the IGBT 201*a* of the semiconductor element 20*v* to switch to the ON state according to a signal level of an input signal SinVH input from the control device 3, the gate drive circuit 22A includes a constant current supply unit 221*v*A configured to supply constant current to the gate G of the IGBT 201*a*. The gate drive circuit 22A has a signal input terminal Tivh to which the input signal SinVH that the control device 3 outputs is input. The constant current supply unit 221*v*A is connected to the signal input terminal Tivh. This configuration allows the input signal SinVH to be input to the constant current supply unit 221*v*A.

The gate drive circuit 22A has a switching signal input terminal Tsw2 to which a switching signal Ssw2 to switch drive capability of the constant current supply unit 221*v*A, which drives the IGBT 201*a* of the semiconductor element 20*v*, is input. To the switching signal input terminal Tsw2, a Zener diode 6*v*H that generates the switching signal Ssw2 and also determines a signal level of the switching signal Ssw2 is connected. The Zener diode 6*v*H is connected between the switching signal input terminal Tsw2 and the reference potential terminal T22. The cathode K of the Zener diode 6*v*H is connected to the switching signal input terminal Tsw2, and the anode A of the Zener diode 6*v*H is connected to the reference potential terminal T22.

The gate drive circuit 22A includes a signal level determination unit 227*v*A configured to determine a signal level of the switching signal Ssw2. The gate drive circuit 22A includes a drive capability switching unit 222*v*A configured to change a current amount of constant current output from the constant current supply unit 221*v*A, based on a determination result in the signal level determination unit 227*v*A and a signal level of the input signal SinVH and thereby switch the drive capability of the constant current supply unit 221vA. An output terminal of the signal level determination unit 227vA is connected to an input terminal of the drive capability switching unit 222vA. By way of this, an output signal including information about a determination result output from the signal level determination unit 227vA can be input to the drive capability switching unit 222vA.

In order to cause the IGBT 201a arranged in the semiconductor element 20w to switch to the ON state according to a signal level of an input signal SinWH input from the control device 3, the gate drive circuit 22A includes a constant current supply unit 221wA configured to supply constant current to the gate G formed in the IGBT 201a. The gate drive circuit 22A has a signal input terminal Tiwh to which the input signal SinWH that the control device 3 outputs is input. The constant current supply unit 221wA is connected to the signal input terminal Tiwh. This allows the input signal SinWH to be input to the constant current supply unit 221wA.

The gate drive circuit 22A has a switching signal input terminal Tsw3 to which a switching signal Ssw3 to switch drive capability of the constant current supply unit 221wA, which drives the IGBT 201a of the semiconductor element 20w, is input. To the switching signal input terminal Tsw3, a Zener diode 6wH that generates the switching signal Ssw3 and also determines a signal level of the switching signal Ssw3 is connected. The Zener diode 6wH is connected between the switching signal input terminal Tsw3 and the reference potential terminal T22. The cathode K of the Zener diode 6wH is connected to the switching signal input terminal Tsw3, and the anode A of the Zener diode 6wH is connected to the reference potential terminal T22.

The gate drive circuit 22A includes a signal level determination unit 227wA configured to determine a signal level of the switching signal Ssw3. The gate drive circuit 22A includes a drive capability switching unit 222wA configured to change a current amount of constant current output from the constant current supply unit 221wA, based on a determination result in the signal level determination unit 227wA and a signal level of the input signal SinWH and thereby switch the drive capability of the constant current supply unit 221wA. An output terminal of the signal level determination unit 227wA is connected to an input terminal of the drive capability switching unit 222wA. By way of this, an output signal including information about a determination result output from the signal level determination unit 227wA can be input to the drive capability switching unit 222wA.

In order to cause the IGBT 211a arranged in the semiconductor element 21u to switch to the ON state according to a signal level of an input signal SinUL input from the control device 3, the gate drive circuit 22A includes a constant current supply unit 223uA configured to supply constant current to the gate G formed in the IGBT 211a. The gate drive circuit 22A has a signal input terminal Tiul to which the input signal SinUL that the control device 3 outputs is input. The constant current supply unit 223uA is connected to the signal input terminal Tiul. This allow the input signal SinUL to be input to the constant current supply unit 223uA.

The gate drive circuit 22A has a switching signal input terminal Tsw4 to which a switching signal Ssw4 to switch drive capability of the constant current supply unit 223uA, which drives the IGBT 211a of the semiconductor element 21u, is input. To the switching signal input terminal Tsw4, a Zener diode 6uL that generates the switching signal Ssw4 and also determines a signal level of the switching signal Ssw4 is connected. The Zener diode 6uL is connected between the switching signal input terminal Tsw4 and the reference potential terminal T22. The cathode K of the Zener diode 6uL is connected to the switching signal input terminal Tsw4, and the anode A of the Zener diode 6uL is connected to the reference potential terminal T22.

The gate drive circuit 22A includes a signal level determination unit 226uA configured to determine a signal level of the switching signal Ssw4. The gate drive circuit 22A includes a drive capability switching unit 224uA configured to change a current amount of constant current output from the constant current supply unit 223uA, based on a determination result in the signal level determination unit 226uA and a signal level of the input signal SinUL and thereby switch the drive capability of the constant current supply unit 223uA. An output terminal of the signal level determination unit 226uA is connected to an input terminal of the drive capability switching unit 224uA. By way of this, an output signal including information about a determination result output from the signal level determination unit 226uA can be input to the drive capability switching unit 224uA.

In order to cause the IGBT 211a arranged in the semiconductor element 21v to switch to the ON state according to a signal level of an input signal SinVL input from the control device 3, the gate drive circuit 22A includes a constant current supply unit 223vA configured to supply constant current to the gate G of the IGBT 211a. The gate drive circuit 22A has a signal input terminal Tivl to which the input signal SinVL that the control device 3 outputs is input. The constant current supply unit 223vA is connected to the signal input terminal Tivl. This allows the input signal SinVL to be input to the constant current supply unit 223vA.

The gate drive circuit 22A has a switching signal input terminal Tsw5 to which a switching signal Ssw5 to switch drive capability of the constant current supply unit 223vA, which drives the IGBT 211a of the semiconductor element 21v, is input. To the switching signal input terminal Tsw5, a Zener diode 6vL that generates the switching signal Ssw5 and also determines a signal level of the switching signal Ssw5 is connected. The Zener diode 6vL is connected between the switching signal input terminal Tsw5 and the reference potential terminal T22. The cathode K of the Zener diode 6vL is connected to the switching signal input terminal Tsw5, and the anode A of the Zener diode 6vL is connected to the reference potential terminal T22.

The gate drive circuit 22A includes a signal level determination unit 226vA configured to determine a signal level of the switching signal Ssw5. The gate drive circuit 22A includes a drive capability switching unit 224vA configured to change a current amount of constant current output from the constant current supply unit 223vA, based on a determination result in the signal level determination unit 226vA and a signal level of the input signal SinVL and thereby switch the drive capability of the constant current supply unit 223vA. An output terminal of the signal level determination unit 226vA is connected to an input terminal of the drive capability switching unit 224vA. By way of this, an output signal including information about a determination result output from the signal level determination unit 226vA can be input to the drive capability switching unit 224vA.

In order to cause the IGBT 211a arranged in the semiconductor element 21w to switch to the ON state according to a signal level of an input signal SinWL input from the control device 3, the gate drive circuit 22A includes a constant current supply unit 223wA configured to supply constant current to the gate G of the IGBT 211a. The gate drive circuit 22A has a signal input terminal Tiwl to which the input signal SinWL that the control device 3 outputs is input. The constant current supply unit 223wA is connected to the signal input terminal Tiwl. This allows the input signal SinWL to be input to the constant current supply unit $223wA$.

The gate drive circuit 22A has a switching signal input terminal Tsw6 to which a switching signal Ssw6 to switch drive capability of the constant current supply unit $223wA$, which drives the IGBT $211a$ of the semiconductor element $21w$, is input. To the switching signal input terminal Tsw6, a Zener diode $6wL$ that generates the switching signal Ssw6 and also determines a signal level of the switching signal Ssw6 is connected. The Zener diode $6wL$ is connected between the switching signal input terminal Tsw6 and the reference potential terminal T22. The cathode K of the Zener diode $6wL$ is connected to the switching signal input terminal Tsw6, and the anode A of the Zener diode $6wL$ is connected to the reference potential terminal T22.

The gate drive circuit 22A includes a signal level determination unit $226wA$ configured to determine a signal level of the switching signal Ssw6. The gate drive circuit 22A includes a drive capability switching unit $224wA$ configured to change a current amount of constant current output from the constant current supply unit $223wA$, based on a determination result in the signal level determination unit $226wA$ and a signal level of the input signal SinWL and thereby switch the drive capability of the constant current supply unit $223wA$. An output terminal of the signal level determination unit $226wA$ is connected to an input terminal of the drive capability switching unit $224wA$. By way of this, an output signal including information about a determination result output from the signal level determination unit $226wA$ can be input to the drive capability switching unit $224wA$.

Although illustration is omitted, the gate drive circuit 22A has a power source terminal to which control voltage to control the constant current supply unit $221uA$ is input, a power source terminal to which control voltage to control the constant current supply unit $221vA$ is input, a power source terminal to which control voltage to control the constant current supply unit $221wA$ is input, and power source terminals to which control voltages to control the constant current supply unit $223uA$, the constant current supply unit $223vA$, and the constant current supply unit $223wA$ are input.

Hereinafter, the semiconductor elements $20u$, $20v$, $20w$, $21u$, $21v$, and $21w$ may simply be referred to as "semiconductor elements $20u$ to $21w$". The constant current supply units $221uA$, $221vA$, $221wA$, $223uA$, $223vA$, and $223wA$ may simply be referred to as "constant current supply units $221uA$ to $223wA$". Further, the drive capability switching units $222uA$, $222vA$, $222wA$, $224uA$, $224vA$, and $224wA$ may simply be referred to as "drive capability switching units $222uA$ to $224wA$". Further, the input signals SinUH, SinVH, SinWH, SinUL, SinVL, and SinWL may simply be referred to as "input signals SinUH to SinWL". Further, the Zener diodes $6uH$, $6vH$, $6wH$, $6uL$, $6vL$, and $6wL$ may simply be referred to as "Zener diodes $6uH$ to $6wL$". Further, the switching signal input terminals Tsw1, Tsw2, Tsw3, Tsw4, Tsw5, and Tsw6 may simply be referred to as "switching signal input terminals Tsw1 to Tsw6". Further, alarm signal output terminals VFOu, VFOv, VFOw, and VFO may simply be referred to as "alarm signal output terminals VFOu to VFO".

As illustrated in FIG. 1, the gate drive circuit 22A includes a protection unit $225uA$ configured to protect the IGBT $201a$ arranged in the semiconductor element $20u$ from overcurrent or a high-temperature condition and protect the constant current supply unit $221uA$ from a malfunction caused by reduction in control voltage. The gate drive circuit 22A includes a protection unit $225vA$ configured to protect the IGBT $201a$ arranged in the semiconductor element $20v$ from overcurrent or a high-temperature condition and protect the constant current supply unit $221vA$ from a malfunction caused by reduction in control voltage. The gate drive circuit 22A includes a protection unit $225wA$ configured to protect the IGBT $201a$ arranged in the semiconductor element $20w$ from overcurrent or a high-temperature condition and protect the constant current supply unit $221wA$ from a malfunction caused by reduction in control voltage. The gate drive circuit 22A includes a protection unit 225 configured to protect the IGBTs $211a$ respectively arranged in the semiconductor elements $21u$, $21v$, and $21w$ from overcurrent or a high-temperature condition and protect the constant current supply units $223uA$, $223vA$, and $223wA$ from a malfunction caused by reduction in control voltage. As described above, the gate drive circuit 22A includes the protection units $225uA$, $225vA$, and $225wA$ for the U-phase, the V-phase, and the W-phase, respectively, on the upper arm side and includes the protection unit 225 shared by the U-phase, the V-phase, and the W-phase on the lower arm side. Details of the protection units $225uA$, $225vA$, $225wA$, and 225 will be described later.

As illustrated in FIG. 1, the gate drive circuit 22A has an alarm signal output terminal VFOu that is connected to the protection unit $225uA$ and to which an alarm signal ALMu generated by the protection unit $225uA$ is output. The gate drive circuit 22A has an alarm signal output terminal VFOv that is connected to the protection unit $225vA$ and to which an alarm signal ALMv generated by the protection unit $225vA$ is output. The gate drive circuit 22A has an alarm signal output terminal VFOw that is connected to the protection unit $225wA$ and to which an alarm signal ALMw generated by the protection unit $225wA$ is output. The gate drive circuit 22A has an alarm signal output terminal VFO that is connected to the protection unit 225 and to which an alarm signal ALM generated by the protection unit 225 is output.

The drive capability of the gate drive circuit 22A is configured to be able to be switched with respect to each of the U-phase, the V-phase, and the W-phase in each of the upper arm and the lower arm by Zener voltages of the Zener diodes $6uH$ to $6wL$. Further, the intelligent power module 2A is configured such that a user of the intelligent power module 2A can mount the Zener diodes $6uH$ to $6wL$ to the switching signal input terminals Tsw1 to Tsw6, respectively. Thus, in the gate drive circuit 22A and the intelligent power module 2A, the drive capability can be switched by a simple method of mounting the Zener diodes $6uH$ to $6wL$ to the switching signal input terminals Tsw1 to Tsw6, respectively.

Although details will be described later, the alarm signal output terminals VFOu to VFO have an open-drain configuration. Thus, when the protection units $225uA$, $225vA$, $225wA$, and 225 do not detect an abnormality of the IGBTs $201a$ and $211a$ and the like, the voltage levels of the alarm signal output terminals VFOu to VFO are a high level, respectively. In contrast, when the protection units $225uA$, $225vA$, $225wA$, and 225 detect an abnormality of the IGBTs $201a$ and $211a$ and the like, the alarm signals ALMu, ALMv, ALMw, and ALM the voltage levels (i.e., signal levels) of which are a low level (for example, the voltage level of the reference potential terminal (for example, 0 V)) are output, respectively.

As illustrated in FIG. 1, the control device 3 is configured to output the input signals SinUH to Sin WL having, for example, a pulse shape to the gate drive circuit 22A. By way of this, the control device 3 is capable of, by controlling the gate drive circuit 22A, controlling the IGBTs 201a included in the respective ones of the semiconductor elements 20u, 20v, and 20w and the IGBTs 211a included in the respective ones of the semiconductor elements 21u, 21v, and 21w by, for example, pulse width modulation (PWM).

(Configuration of Drive Circuit of Switching Element)

Next, a schematic configuration of the gate drive circuit 22A serving as the drive circuit of switching elements according to the present embodiment will be described using FIG. 2 with reference to FIG. 1. The constant current supply units 221uA to 223wA have the same configuration as one another. Thus, the configurations of the constant current supply units 221uA to 223wA will be described using the constant current supply unit 223uA as an example. The drive capability switching units 222uA to 224wA have the same configuration as one another. Thus, the configurations of the drive capability switching units 222uA to 224wA will be described using the drive capability switching unit 224uA as an example.

Figure 2:
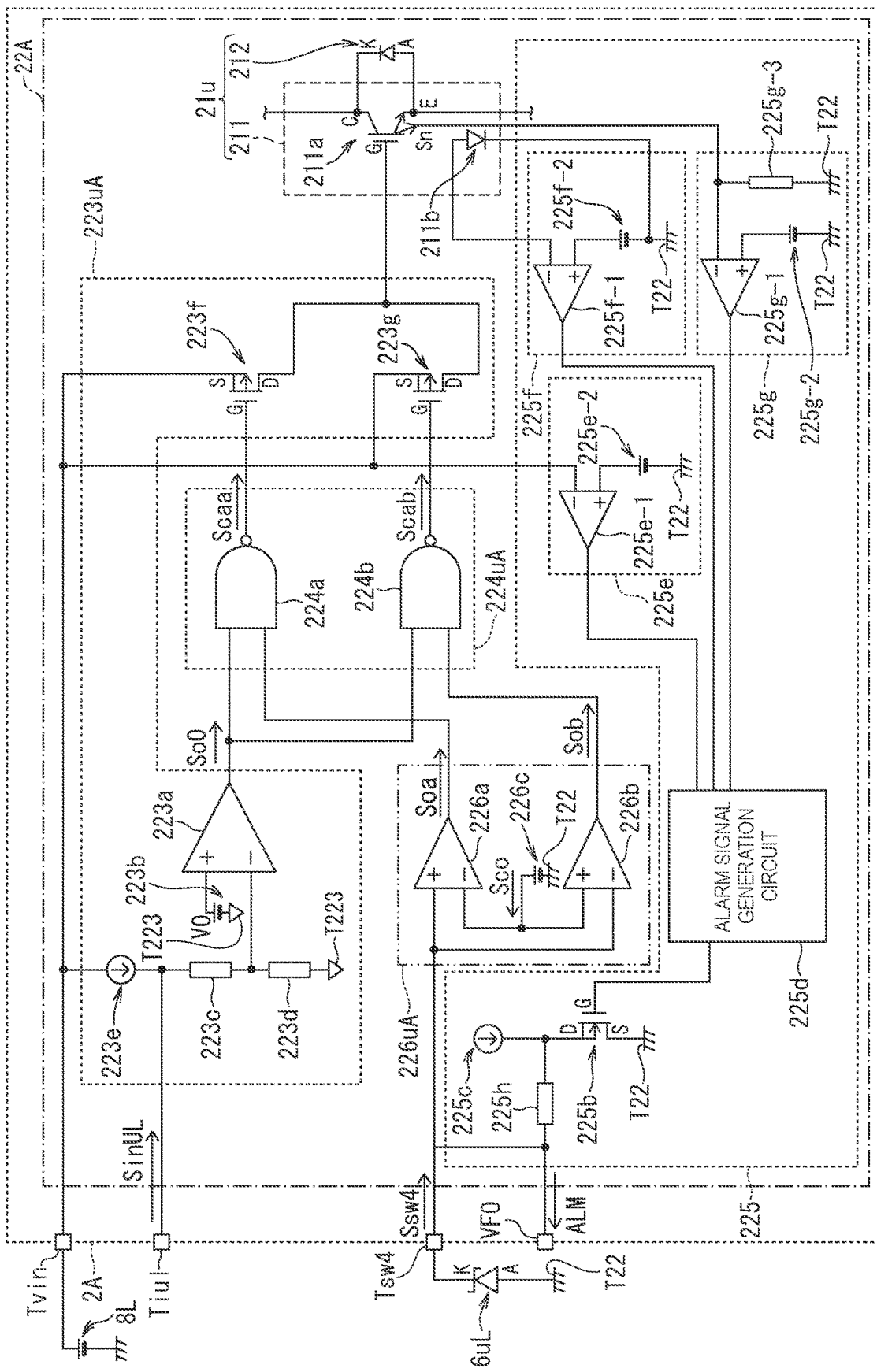
FIG. 2 is a circuit block diagram illustrating an example of a gate drive circuit serving as a drive circuit of a switching element according to the first embodiment of the present invention.

FIG. 2 is a circuit block diagram illustrating a schematic configuration of the gate drive circuit 22A. In FIG. 2, among the constituent components arranged in the gate drive circuit 22A, the constant current supply unit 223uA, the drive capability switching unit 224uA, and the protection unit 225 are illustrated. Further, in FIG. 2, to facilitate understanding, the semiconductor element 21u including the IGBT 211a to which the constant current supply unit 223uA supplies current, the Zener diode 6uL connected to the switching signal input terminal Tsw4, and a power source 8L connected to a power source terminal Tvin are also illustrated.

As illustrated in FIG. 2, the constant current supply unit 223uA includes a constant current source 223e connected to the power source terminal Tvin and a resistance element 223c and a resistance element 223d connected in series between the constant current source 223e and a reference potential terminal T223. One terminal of the resistance element 223c is connected to a current output terminal of the constant current source 223e, and the other terminal of the resistance element 223c is connected to one terminal of the resistance element 223d. A connection point between the output terminal of the constant current source 223e and the one terminal of the resistance element 223c is connected to the signal input terminal Tiul.

The other terminal of the resistance element 223d is connected to the reference potential terminal T223. The constant current supply unit 223uA is a constituent element that drives the semiconductor element 21u constituting the lower arm. Thus, the reference potential terminal T223 is connected to the reference potential terminal T22 and, for example, connected to the ground terminal. Note that reference potential terminals (not shown) that are arranged in the constant current supply units 221uA, 221vA, and 221wA (see FIG. 1) driving the semiconductor elements 20u, 20v, and 20w constituting the upper arm and correspond to the reference potential terminal T223 are, for example, connected to the emitters E of the IGBTs 201a (see FIG. 1) arranged in the semiconductor elements 20u, 20v, and 20w.

The constant current supply unit 223uA includes a comparator 223a formed by, for example, an operational amplifier and a voltage generation unit 223b connected to the non-inverting input terminal (+) of the comparator 223a. The inverting input terminal (−) of the comparator 223a is connected to a connection point between the other terminal of the resistance element 223c and the one terminal of the resistance element 223d. The output terminal of the comparator 223a is connected to the drive capability switching unit 224uA.

The voltage generation unit 223b is configured by, for example, a constant voltage source. The negative electrode side of the voltage generation unit 223b is connected to the reference potential terminal T223. The positive electrode side of the voltage generation unit 223b is connected to the non-inverting input terminal (+) of the comparator 223a. The voltage generation unit 223b is configured to generate a comparison voltage V0 that serves as a reference for comparison in the comparator 223a. The comparison voltage V0 is set to a voltage level that allows which one of the high level and the low level the signal level of the input signal SinUL input from the signal input terminal Tiul is to be detected. To the inverting input terminal (−) of the comparator 223a, a divided voltage obtained by resistance-dividing the signal level (i.e., voltage level) of the input signal SinUL by the resistance value of the resistance element 223c and the resistance value of the resistance element 223d is input. Thus, the voltage level of the comparison voltage V0 is set to be a voltage between a divided voltage in the case where the signal level of the input signal SinUL is a maximum level and a divided voltage in the case where the signal level of the input signal SinUL is a minimum level.

By way this, the comparator 223a is capable of determining whether the signal level of the input signal SinUL input from the signal input terminal Tiul is the high level or the low level. When the voltage level of the divided voltage input to the inverting input terminal (−) is lower than the voltage level of the comparison voltage V0, that is, when the signal level of the input signal SinUL is the low level, the comparator 223a outputs an output signal So0 the signal level of which is the high level to the drive capability switching unit 224uA. On the other hand, when the voltage level of the divided voltage input to the inverting input terminal (−) is higher than the voltage level of the comparison voltage V0, that is, when the signal level of the input signal SinUL is the high level, the comparator 223a outputs the output signal So0 the signal level of which is the low level to the drive capability switching unit 224uA.

As illustrated in FIG. 2, the constant current supply unit 223uA includes a plurality of (two in the present embodiment) transistors 223f and 223g configured to supply constant current to the gate G of the IGBT 211a arranged in the semiconductor element 21u. The transistor 223f and the transistor 223g are respectively formed by, for example, P-type MOS field effect transistors (FETs). The source S of each of the transistor 223f and the transistor 223g is connected to the power source terminal Tvin. The drain D of each of the transistor 223f and the transistor 223g is connected to the gate G of the IGBT 211a arranged in the semiconductor element 21u. The gate G of the transistor 223f and the gate G of the transistor 223g are respectively connected to the drive capability switching unit 224uA.

Current amounts of constant currents that the transistors 223f and 223g (an example of at least two transistors among a plurality of transistors) respectively supplies to the gate G of the IGBT 211a arranged in the semiconductor element 21u are different from each other. For example, the transistor 223f has a larger transistor size than the transistor 223g. By way of this, the current amount of the constant current from the transistor 223f is larger than the current amount of the constant current from the transistor 223g.

Although details will be described later, in the case where the transistor 223f is selected as a transistor to supply constant current to the IGBT 211a arranged in the semiconductor element 21u, the constant current supply unit 223uA is capable of causing the IGBT 211a to switch to the ON state with higher drive capability than a case where the transistor 223g is selected. On the other hand, in the case where the transistor 223g is selected as a transistor to supply constant current to the IGBT 211a arranged in the semiconductor element 21u, the constant current supply unit 223uA is capable of causing the IGBT 211a to switch to the ON state with lower drive capability than a case where the transistor 223f is selected. As described above, the constant current supply unit 223uA is capable of, by changing a transistor to be caused to operate between the transistor 223g and the transistor 223f, switching drive capability to drive the IGBT 211a.

As illustrated in FIG. 2, the protection unit 225 included in the gate drive circuit 22A includes a temperature detection circuit (an example of a temperature detection unit) 225f configured to detect temperature of the IGBT 211a, a current detection circuit (an example of a current detection unit) 225g configured to detect current flowing through the IGBT 211a, a control voltage detection circuit (an example of a control voltage detection unit) 225e configured to detect control voltage to control the constant current supply unit 223uA, and an alarm signal generation circuit (an example of an alarm signal generation unit) 225d configured to generate an alarm signal ALM notifying that at least one of the temperature detection circuit 225f, the current detection circuit 225g, and the control voltage detection circuit 225e has detected an abnormality.

As illustrated in FIG. 2, a temperature detection element 211b arranged in the IGBT chip 211 is formed by, for example, a diode. The diode is formed of, for example, silicon. The temperature detection element 211b is connected to the temperature detection circuit 225f. The temperature detection circuit 225f includes a comparator 225f-1 configured to compare a comparison signal set to a predetermined signal level with a detection signal detected by the temperature detection element 211b. The temperature detection circuit 225f includes a voltage generation unit 225f-2 configured to generate a voltage of the comparison signal. The comparator 225f-1 is formed by, for example, an operational amplifier. The voltage generation unit 225f-2 is formed by, for example, a constant voltage source. The voltage generation unit 225f-2 generates, for example, a voltage corresponding to the absolute maximum rated temperature of the IGBT 211a.

The anode of the temperature detection element 211b is connected to the inverting input terminal (−) of the comparator 225f-1, and the cathode of the temperature detection element 211b is connected to the reference potential terminal T22. The non-inverting input terminal (+) of the comparator 225f-1 is connected to the positive electrode side of the voltage generation unit 225f-2. The output terminal of the comparator 255f-1 is connected to an input terminal of the alarm signal generation circuit 225d. The negative electrode side of the voltage generation unit 225f-2 is connected to the reference potential terminal T22.

Although illustration is omitted, to the anode of the temperature detection element 211b, a constant current source is connected. The forward voltage of a diode made of silicon is generally lower in the case where ambient temperature is high than in the case where the ambient temperature is low. Thus, when the temperature of the IGBT 211a increases in the case where constant current is input from the constant current source to the temperature detection element 211b, the voltage drop in the temperature detection element 211b becomes small. As a result, the voltage input from the temperature detection element 211b to the temperature detection circuit 225f decreases as the temperature of the IGBT 211a increases.

Thus, when the temperature of the IGBT 211a is lower than the absolute maximum rated temperature, since voltage detected by the temperature detection element 211b is higher than the voltage of the comparison signal generated by the voltage generation unit 225f-2, the comparator 225f-1 outputs an output signal the signal level of which is the low level to the alarm signal generation circuit 225d. In contrast, when the temperature of the IGBT 211a is higher than the absolute maximum rated temperature, since voltage detected by the temperature detection element 211b is lower than the voltage of the comparison signal generated by the voltage generation unit 225f-2, the comparator 225f-1 outputs an output signal the signal level of which is the high level to the alarm signal generation circuit 225d. As described above, the temperature detection circuit 225f is capable of, by using voltage that is input from the temperature detection element 211b and changes according to the temperature of the IGBT 211a, detecting whether or not the temperature of the IGBT 211a exceeds the absolute maximum rated temperature of the IGBT 211a.

As illustrated in FIG. 2, the current detection circuit 225g includes a resistance element 225g-3 connected between the current detection terminal Sn of the IGBT 211a and the reference potential terminal T22. One terminal of the resistance element 225g-3 is connected to the current detection terminal Sn, and the other terminal of the resistance element 225g-3 is connected to the reference potential terminal T22. The current detection circuit 225g is configured to output, as detection voltage, a voltage drop occurring across the resistance element 225g-3 caused by detection current that is output from the current detection terminal Sn flowing through the resistance element 225g-3. In other words, the current detection circuit 225g outputs voltage at one terminal of the resistance element 225g-3 connected to the current detection terminal Sn as detection voltage.

The current detection circuit 225g includes a comparator 225g-1 connected to the one terminal of the resistance element 225g-3 and a voltage generation unit 225g-2 configured to generate reference voltage serving as a reference for comparison in the comparator 225g-1.

The voltage generation unit 225g-2 is formed by, for example, a DC power source. The negative electrode side of the voltage generation unit 225g-2 is connected to the reference potential terminal T22. The voltage generation unit 225g-2 is configured to generate a comparison voltage having a predetermined voltage level. The comparison voltage is set to, for example, a voltage corresponding to the absolute maximum rated current of the IGBT 211a.

The comparator 225g-1 is formed by, for example, an operational amplifier. To the inverting input terminal (−) of the comparator 225g-1, the current detection terminal Sn and one terminal of the resistance element 225g-3 are connected. To the non-inverting input terminal (+) of the comparator 225g-1, the positive electrode side of the voltage generation unit 225g-2 is connected. The output terminal of the comparator 225g-1 is connected to an input terminal of the alarm signal generation circuit 225d. When detection voltage that is a voltage drop across the resistance element 225g-3 is lower than the comparison voltage generated by the voltage generation unit 225g-2, the comparator 225g-1 outputs an output signal the signal level (i.e., a voltage level) of which is the low level to the alarm signal generation circuit 225d. In addition, when the detection voltage is higher than the comparison voltage, the comparator 225g-1 outputs an output signal the signal level of which is the high level to the alarm signal generation circuit 225d.

The detection current output from the current detection terminal Sn is proportional to current output from the emitter E of the IGBT 211a. Thus, when voltage corresponding to the detection current output from the current detection terminal Sn is lower than voltage corresponding to the absolute maximum rated current of the IGBT 211a (i.e., when the IGBT 211a is in a normal state), the current detection circuit 225g outputs an output signal the signal level of which is the low level. In contrast, when voltage corresponding to the detection current output from the current detection terminal Sn is higher than voltage corresponding to the absolute maximum rated current of the IGBT 211a (i.e., when overcurrent is flowing through the IGBT 211a), the current detection circuit 225g outputs an output signal the signal level of which is the high level.

As illustrated in FIG. 2, the control voltage detection circuit 225e includes a comparator 225e-1 connected to the power source terminal Tvin and a voltage generation unit 225e-2 configured to generate reference voltage serving as a reference for comparison in the comparator 225e-1.

The voltage generation unit 225e-2 is formed by, for example, a DC power source. The negative electrode side of the voltage generation unit 225e-2 is connected to the reference potential terminal T22. The voltage generation unit 225e-2 is configured to generate a comparison voltage having a predetermined voltage level. The comparison voltage is set to, for example, a minimum voltage at which the constant current supply unit 223uA can operate.

The comparator 225e-1 is formed by, for example, an operational amplifier. To the inverting input terminal (−) of the comparator 225e-1, the power source terminal Tvin is connected. To the non-inverting input terminal (+) of the comparator 225e-1, the positive electrode side of the voltage generation unit 225e-2 is connected. The output terminal of the comparator 225e-1 is connected to an input terminal of the alarm signal generation circuit 225d. When the control voltage input from the power source terminal Tvin is higher than the comparison voltage generated by the voltage generation unit 225e-2, the comparator 225e-1 outputs an output signal the signal level (i.e., a voltage level) of which is the low level to the alarm signal generation circuit 225d. In addition, when the control voltage is lower than the comparison voltage, the comparator 225e-1 outputs an output signal the signal level of which is the high level to the alarm signal generation circuit 225d.

Thus, when the control voltage input from the power source terminal Tvin is higher than the minimum voltage at which the constant current supply unit 223uA can operate (i.e., when the constant current supply unit 223uA can normally operate), the control voltage detection circuit 225e outputs an output signal the signal level of which is the low level. In contrast, when the control voltage input from the power source terminal Tvin is lower than the minimum voltage at which the constant current supply unit 223uA can operate (i.e., when the constant current supply unit 223uA cannot normally operate), the control voltage detection circuit 225e outputs an output signal the signal level of which is the high level.

As described above, each of the temperature detection circuit 225f, the current detection circuit 225g, and the control voltage detection circuit 225e outputs an output signal the signal level of which is the low level to the alarm signal generation circuit 225d when detecting that a detection target is in a normal state and outputs an output signal the signal level of which is the high level to the alarm signal generation circuit 225d when detecting that the detection target is in an abnormal state.

Although illustration is omitted, the protection unit 225 includes a temperature detection circuit that has the same configuration as the temperature detection circuit 225f and detects temperature of the IGBT 211a arranged in the semiconductor element 21v and a current detection circuit that has the same configuration as the current detection circuit 225g and detects current flowing through the IGBT 211a arranged in the semiconductor element 21v. Further, the protection unit 225 includes a temperature detection circuit that has the same configuration as the temperature detection circuit 225f and detects temperature of the IGBT 211a arranged in the semiconductor element 21w and a current detection circuit that has the same configuration as the current detection circuit 225g and detects current flowing through the IGBT 211a arranged in the semiconductor element 21w. Output signals output from the detection circuits are input to the alarm signal generation circuit 225d.

When none of the control voltage detection circuit 225e, the temperature detection circuit 225f and the current detection circuit 225g that subject the semiconductor element 21u to detection of temperature and current, the temperature detection circuit and the current detection circuit (not shown) that subject the semiconductor element 21v (see FIG. 1) to detection of temperature and current, and the temperature detection circuit and the current detection circuit (not shown) that subject the semiconductor element 21w (see FIG. 1) to detection of temperature and current detects an abnormality, the alarm signal generation circuit 225d outputs an output signal the signal level (i.e., a voltage level) of which is the low level. In contrast, when at least one of the control voltage detection circuit 225e, the temperature detection circuit 225f and the current detection circuit 225g that subject the semiconductor element 21u to detection of temperature and current, the temperature detection circuit and the current detection circuit that subject the semiconductor element 21v to detection of temperature and current, and the temperature detection circuit and the current detection circuit that subject the semiconductor element 21w to detection of temperature and current detects an abnormality, the alarm signal generation circuit 225d outputs an output signal the signal level of which is the high level. Hereinafter, the control voltage detection circuit 225e, the temperature detection circuit 225f and the current detection circuit 225g that subject the semiconductor element 21u to detection of temperature and current, the temperature detection circuit and the current detection circuit that subject the semiconductor element 21v to detection of temperature and current, and the temperature detection circuit and the current detection circuit that subject the semiconductor element 21w to detection of temperature and current are sometimes referred to as "respective types of detection circuits".

The protection unit 225 includes a transistor 225b having the gate G connected to the output terminal of the alarm signal generation circuit 225d and a constant current source 225c connected to the drain D of the transistor 225b. The transistor 225b is formed by, for example, an N-type MOSFET. The source S of the transistor 225b is connected to the reference potential terminal T22.

When none of the respective types of detection circuits detects an abnormality, the alarm signal generation circuit 225d outputs an output signal the signal level of which is the low level to the gate G of the transistor 225b. In contrast, when at least one of the respective types of detection circuits detects an abnormality, the alarm signal generation circuit 225d outputs an output signal the signal level of which is the high level to the gate G of the transistor 225*b* only for a predetermined period. Therefore, when the gate drive circuit 22A changes from a normal state to an abnormal state, the alarm signal generation circuit 225*d* outputs a pulse-shaped output signal the signal level of which is the high level to the gate G of the transistor 225*b* only for a predetermined period.

Thus, when the gate drive circuit 22A is in the normal state, the transistor 225*b* is put into the OFF state. In contrast, when the gate drive circuit 22A changes from the normal state to an abnormal state, the transistor 225*b* is put into the ON state only for a period during which the signal level of the output signal output from the alarm signal generation circuit 225*d* is the high level. A case where the gate drive circuit 22A is not in an abnormal state is a case where the temperature and current are a temperature and current at which the IGBT 211*a* can operate and the control voltage input from the power source terminal Tvin has a voltage value at which the constant current supply units 221*u*A to 223*w*A can operate. Further, a case where the gate drive circuit 22A is in an abnormal state is a case where the gate drive circuit 22A is in at least one state of a state in which the IGBT 211*a* is in a high-temperature condition or an overcurrent condition and a state in which the control voltage input from the power source terminal Tvin has a voltage value at which the constant current supply units 221*u*A to 223*w*A cannot operate.

The protection unit 225 includes a resistance element 225*h* connected between a connection point between the drain D of the transistor 225*b* and the output terminal of the constant current source 225*c* and the alarm signal output terminal VFO. One terminal of the resistance element 225*h* is connected to the connection point between the drain D of the transistor 225*b* and the output terminal of the constant current source 225*c*. The other terminal of the resistance element 225*h* is connected to the alarm signal output terminal VFO.

Since the alarm signal output terminal VFO is connected to the drain D of the transistor 225*b* via the resistance element 225*h*, the alarm signal output terminal VFO is an open drain output terminal. When the gate drive circuit 22A is in the normal state, since the signal level of the output signal output from the alarm signal generation circuit 225*d* is the low level, the transistor 225*b* is put into the OFF state. Thus, the voltage at the alarm signal output terminal VFO becomes a high level voltage. In contrast, when the gate drive circuit 22A is in an abnormal state, since the signal level of the output signal output from the alarm signal generation circuit 225*d* is the high level, the transistor 225*b* is put into the ON state. Thus, the voltage at the alarm signal output terminal VFO becomes the potential of the reference potential terminal T22 (for example, 0 V). As described above, the voltage at the alarm signal output terminal VFO becomes voltage obtained by inverting the voltage of the output signal output from the alarm signal generation circuit 225*d*. As a result, the alarm signal ALM based on the output signal output from the alarm signal generation circuit 225*d* is output from the alarm signal output terminal VFO.

Although illustration is omitted, the protection unit 225*u*A has the same configuration as the protection unit 225 and is configured to function in the same manner as the protection unit 225 except that the protection unit 225*u*A detects an abnormality in only the control voltage of the constant current supply unit 221*u*A and the semiconductor element 20*u* that the constant current supply unit 221*u*A drives. Further, the protection unit 225*v*A has the same configuration as the protection unit 225 and is configured to function in the same manner as the protection unit 225 except that the protection unit 225*v*A detects an abnormality in only the control voltage of the constant current supply unit 221*v*A and the semiconductor element 20*v* that the constant current supply unit 221*v*A drives. Further, the protection unit 225*w*A has the same configuration as the protection unit 225 and is configured to function in the same manner as the protection unit 225 except that the protection unit 225*w*A detects an abnormality in only the control voltage of the constant current supply unit 221*w*A and the semiconductor element 20*w* that the constant current supply unit 221*w*A drives.

As illustrated in FIG. 2, the signal level determination unit 226*u*A includes a plurality of (two in the present embodiment) comparators 226*a* and 226*b* configured to compare a comparison signal Sco set to a predetermined signal level with the switching signal Ssw4. The signal level determination unit 226*u*A includes a voltage generation unit 226*c* configured to generate voltage of the comparison signal Sco. The comparators 226*a* and 226*b* are respectively formed by, for example, operational amplifiers. The voltage generation unit 226*c* is formed by, for example, a constant voltage source.

The non-inverting input terminal (+) of the comparator 226*a* is connected to the switching signal input terminal Tsw4, the alarm signal output terminal VFO, and the other terminal of the resistance element 225*h*. The inverting input terminal (−) of the comparator 226*a* is connected to the positive electrode side of the voltage generation unit 226*c*. The output terminal of the comparator 226*a* is connected to the drive capability switching unit 224*u*A. The non-inverting input terminal (+) of the comparator 226*b* is connected to the positive electrode side of the voltage generation unit 226*c*. The inverting input terminal (−) of the comparator 226*b* is connected to the switching signal input terminal Tsw4, the alarm signal output terminal VFO, and the other terminal of the resistance element 225*h*. The output terminal of the comparator 226*b* is connected to the drive capability switching unit 224*u*A. As described above, the comparator 226*a* and the comparator 226*b* have a relationship in which input destinations are reversed to each other. Thus, the comparator 226*a* and the comparator 226*b* (an example of at least two comparators among a plurality of comparators) output signals the signal levels of which are inverted to each other to the drive capability switching unit 224*u*A.

The negative electrode side of the voltage generation unit 226*c* is connected to the reference potential terminal T22. The voltage generation unit 226*c* is configured to generate voltage of the comparison signal Sco that serves as a reference for comparison in the comparators 226*a* and 226*b*. The Zener diode 6*u*L that has a Zener voltage is connected to the switching signal input terminal Tsw4 in such a way that the signal level of the switching signal Ssw4 becomes higher or lower than the signal level of the comparison signal Sco. In the present embodiment, the voltage level of voltage that the voltage generation unit 226*c* generates is set in advance. Thus, the Zener diode 6*u*L that has a Zener voltage having a voltage level different from the voltage level of the voltage that the voltage generation unit 226*c* generates is connected to the switching signal input terminal Tsw4 in such a way that the drive capability of all the constant current supply units including the constant current supply unit 223*u*A that are included in the gate drive circuit 22A coincides with a desired drive capability of a user of the intelligent power module 2A. The intelligent power module 2A is configured such that the user of the intelligent power module 2A can connect the Zener diode 6uL to the switching signal input terminal Tsw4.

When a Zener diode 6uL having a Zener voltage higher than the voltage generated by the voltage generation unit 226c is connected to the switching signal input terminal Tsw4, the signal level of the switching signal Ssw4 becomes higher than the signal level of the comparison signal Sco. Therefore, in this case, the comparator 226a outputs an output signal Soa the signal level of which is the high level to the drive capability switching unit 224uA, and the comparator 226b outputs an output signal Sob the signal level of which is the low level to the drive capability switching unit 224uA. In contrast, when a Zener diode 6uL having a Zener voltage lower than the voltage generated by the voltage generation unit 226c is connected to the switching signal input terminal Tsw4, the signal level of the switching signal Ssw4 becomes lower than the signal level of the comparison signal Sco. Therefore, in this case, the comparator 226a outputs the output signal Soa the signal level of which is the low level to the drive capability switching unit 224uA, and the comparator 226b outputs the output signal Sob the signal level of which is the high level to the drive capability switching unit 224uA.

As illustrated in FIG. 2, the drive capability switching unit 224uA includes a negative AND (NAND) gate 224a (an example of a first operation unit) that performs a logical operation on the signal level of the output signal Soa of the comparator 226a (an example of one of two comparators) and the signal level of the output signal So0 (an example of a signal based on an input signal) of the comparator 223a. In addition, the drive capability switching unit 224uA includes a negative AND (NAND) gate 224b (an example of a second operation unit) that performs a logical operation on the signal level of the output signal Sob of the comparator 226b (an example of the other of the two comparators) and the signal level of the output signal So0.

One input terminal of the NAND gate 224a is connected to the output terminal of the comparator 223a arranged in the constant current supply unit 223uA. The other input terminal of the NAND gate 224a is connected to the output terminal of the comparator 226a arranged in the signal level determination unit 226uA. The output terminal of the NAND gate 224a is connected to the gate G of the transistor 223f arranged in the constant current supply unit 223uA. Thus, the NAND gate 224a outputs an operation result signal Scaa to the gate G (an example of a control signal input terminal of one of two transistors) of the transistor 223f.

One input terminal of the NAND gate 224b is connected to the output terminal of the comparator 223a arranged in the constant current supply unit 223uA. The other input terminal of the NAND gate 224b is connected to the output terminal of the comparator 226b arranged in the signal level determination unit 226uA. The output terminal of the NAND gate 224b is connected to the gate G of the transistor 223g arranged in the constant current supply unit 223uA. Thus, the NAND gate 224b outputs an operation result signal Scab to the gate G (an example of a control signal input terminal of the other of the two transistors) of the transistor 223g.

To the other input terminals of the respective ones of the NAND gates 224a and 224b, the output signal So0 is input. On the other hand, to one input terminals of the respective ones of the NAND gates 224a and 224b, the output signals Soa and Sob the signal levels of which are inverted to each other are input, respectively. Thus, when the signal level of the output signal So0 is the high level, the NAND gates 224a and 224b output the operation result signals Scaa and Scab the signal levels of which are inverted to each other to the gates G of the respective ones of the transistors 223f and 223g. By way of this, when the transistor 223f switches to the ON state, the transistor 223g maintains the OFF state, and, when the transistor 223g switches to the ON state, the transistor 223f maintains the OFF state.

The output signal So0 output from the comparator 223a is a signal based on the input signal SinUL. Thus, the NAND gates 224a and 224b that perform a logical operation using the signal level of the output signal So0 are configured to perform a logical operation, based on the signal level of the input signal SinUL. Therefore, the drive capability switching unit 224uA controls at least one of the transistors 223f and 223g to the ON state, based on the determination results (i.e., the signal levels of the output signals Soa and Sob) in the signal level determination unit 226uA and the signal level of the input signal SinUL. In the present embodiment, the drive capability switching unit 224uA controls either of the transistors 223f and 223g to the ON state.

Note that, in the drive capability switching units 222uA, 222vA, and 222wA for driving the semiconductor elements 20u, and 20w that constitute the upper arm portion, voltage level shift circuits may be connected to the input terminals of the NAND gates 224a and 224b. The output signals So0, Soa, and Sob are input to the voltage level shift circuits. By way of this, the voltage levels of the output signals So0, Soa, and Sob are converted to voltage levels matching the upper arm portion and subsequently are logically operated by the NAND gates 224a and 224b.

Further, in the constant current supply units 221uA, 221vA, and 221wA for driving the semiconductor elements 20u, and 20w that constitute the upper arm portion, the sources S of the respective ones of the transistors 223f and 223g are individually connected to the power source terminals of the respective ones of the U-phase, the V-phase, and the W-phase of the upper arm portion.

(Operation of Drive Circuit of Switching Element)

Next, operation of the gate drive circuit 22A serving as the drive circuit of switching elements according to the present embodiment will be described using FIGS. 1 and 2. The constant current supply units 221uA to 223wA operate in the same manner as one another. Thus, operation of the constant current supply units 221uA to 223wA will be described using the constant current supply unit 223uA as an example. The drive capability switching units 222uA to 224wA operate in the same manner as one another. Thus, operation of the drive capability switching units 222uA to 224wA will be described using the drive capability switching unit 224uA as an example.

Table 1 is a truth table of the transistors 223f and 223g arranged in the constant current supply unit 223uA. "SinUL" in Table 1 indicates the input signal SinUL input to the constant current supply unit 223uA from the control device 3. "So0" in Table 1 indicates the output signal So0 that the comparator 223a arranged in the constant current supply unit 223uA outputs. "Soa" in Table 1 indicates the output signal Soa that the comparator 226a arranged in the signal level determination unit 226uA outputs. "Sob" in Table 1 indicates the output signal Sob that the comparator 226b arranged in the signal level determination unit 226uA outputs.

"Scaa" in Table 1 indicates the operation result signal Scaa that the NAND gate 224a arranged in the drive capability switching unit 224uA outputs. "Scab" in Table 1 indicates the operation result signal Scab that the NAND gate 224b arranged in the drive capability switching unit 224uA outputs. "Qf" in Table 1 indicates the transistor 223f arranged in the constant current supply unit 223uA. "Qg" in Table 1 indicates the transistor 223g arranged in the constant current supply unit 223uA. "L" in Table 1 indicates that the signal level is the low level. "H" in Table 1 indicates that the signal level is the high level. "ON" in Table 1 indicates that the transistor is in the ON state. "OFF" in Table 1 indicates that the transistor is in the OFF state.

TABLE 1

|  | SinUL | So0 | Soa | Sob | Scaa | Scab | Qf | Qg |
|---|---|---|---|---|---|---|---|---|
| Ssw4 > Sco | H | L | H | L | H | H | OFF | OFF |
|  | L | H | H | L | L | H | ON | OFF |
| Ssw4 < Sco | H | L | L | H | H | H | OFF | OFF |
|  | L | H | L | H | H | L | OFF | ON |

(Case where Ssw4>Sco)

First, operation of the gate drive circuit 22A in the case where the Zener voltage of the Zener diode 6uL is higher than the voltage generated by the voltage generation unit 226c arranged in the signal level determination unit 226uA, that is, in the case where the signal level of the switching signal Ssw4 is higher than the signal level of the comparison signal Sco, will be described.

When the input signal SinUL the signal level of which is the high level is input from the control device 3 to the constant current supply unit 223uA, the signal level of the output signal So0 output from the comparator 223a becomes the low level, as shown in the upper row in the row "Ssw4>Sco" in table 1.

When the output signal So0 the signal level of which is the low level is input to the other input terminal of the NAND gate 224a arranged in the drive capability switching unit 224uA, the NAND gate 224a outputs the operation result signal Scaa the signal level of which is the high level, regardless of the signal level of the output signal Soa input to one input terminal, as shown in Table 1. Likewise, when the output signal So0 the signal level of which is the low level is input to the other input terminal of the NAND gate 224b arranged in the drive capability switching unit 224uA, the NAND gate 224b outputs the operation result signal Scab the signal level of which is the high level, regardless of the signal level of the output signal Sob input to one input terminal, as shown in Table 1.

As a result, as shown in the upper row in the row "Ssw4>Sco" in Table 1, both transistors 223f and 223g arranged in the constant current supply unit 223uA are controlled to the OFF state. Thus, when the IGBT 211a arranged in the semiconductor element 21u is in the OFF state, the constant current supply unit 223uA drives the IGBT 211a to maintain the OFF state. In contrast, when the IGBT 211a is in the ON state, the constant current supply unit 223uA drives the IGBT 211a to switch from the ON state to the OFF state. That is, the constant current supply unit 223uA drives the IGBT 211a to turn off.

When the input signal SinUL the signal level of which is the low level is input from the control device 3 to the constant current supply unit 223uA, the signal level of the output signal So0 output from the comparator 223a becomes the high level, as shown in the lower row in the row "Ssw4>Sco" in Table 1.

Since the signal level of the switching signal Ssw4 is higher than the signal level of the comparison signal Sco, the comparator 226a arranged in the signal level determination unit 226uA outputs the output signal Soa the signal level of which is the high level, as shown in the lower row in the row "Ssw4>Sco" in Table 1. When the output signal Soa the signal level of which is the high level is input to one input terminal of the NAND gate 224a and the output signal So0 the signal level of which is the high level is input to the other input terminal of the NAND gate 224a, the NAND gate 224a outputs the operation result signal Scaa the signal level of which is the low level to the gate G of the transistor 223f, as shown in the lower row in the row "Ssw4>Sco" in Table 1.

On the other hand, as shown in the lower row in the row "Ssw4>Sco" in Table 1, the comparator 226b arranged in the signal level determination unit 226uA outputs the output signal Sob the signal level of which is the low level. When the output signal Sob the signal level of which is the low level is input to one input terminal of the NAND gate 224b and the output signal So0 the signal level of which is the high level is input to the other input terminal of the NAND gate 224b, the NAND gate 224b outputs the operation result signal Scab the signal level of which is the high level to the gate G of the transistor 223g, as shown in the lower row in the row "Ssw4>Sco" in Table 1.

As a result, as shown in the lower row in the row "Ssw4>Sco" in Table 1, the transistor 223f is controlled to the ON state and the transistor 223g is controlled to the OFF state. Thus, when the IGBT 211a arranged in the semiconductor element 21u is in the OFF state, the constant current supply unit 223uA supplies the IGBT 211a with constant current from the transistor 223f that has a larger current amount of constant current between the transistors 223f and 223g. By way of this, the constant current supply unit 223uA causes the IGBT 211a to switch to the ON state with high drive capability.

In contrast, when the IGBT 211a is in the ON state, the constant current supply unit 223uA drives the IGBT 211a to maintain the ON state by supplying constant current from the transistor 223f to the IGBT 211a.

(Case where Ssw4<Sco)

Next, operation of the gate drive circuit 22A in the case where the Zener voltage of the Zener diode 6uL is lower than the voltage generated by the voltage generation unit 226c arranged in the signal level determination unit 226uA, that is, in the case where the signal level of the switching signal Ssw4 is lower than the signal level of the comparison signal Sco, will be described.

The drive capability switching unit 224uA operates in the same manner between the case where the signal level of the switching signal Ssw4 is lower than the signal level of the comparison signal Sco and the case where the signal level of the switching signal Ssw4 is higher than the signal level of the comparison signal Sco. Thus, as shown in the upper row in the row "Ssw4<Sco" in Table 1, both transistors 223f and 223g are controlled to the OFF state. Therefore, the constant current supply unit 223uA drives the IGBT 211a arranged in the semiconductor element 21u in the same manner as in the case where the signal level of the switching signal Ssw4 is higher than the signal level of the comparison signal Sco.

When the input signal SinUL the signal level of which is the low level is input from the control device 3 to the constant current supply unit 223uA, the signal level of the output signal So0 output from the comparator 223a becomes the high level, as shown in the lower row in the row "Ssw4<Sco" in Table 1.

Since the signal level of the switching signal Ssw4 is lower than the signal level of the comparison signal Sco, the comparator 226a outputs the output signal Soa the signal level of which is the low level, as shown in the lower row in the row "Ssw4<Sco" in Table 1. When the output signal Soa the signal level of which is the low level is input to one input terminal of the NAND gate 224a and the output signal So0 the signal level of which is the high level is input to the other input terminal of the NAND gate 224a, the NAND gate 224a outputs the operation result signal Scaa the signal level of which is the high level to the gate G of the transistor 223f, as shown in the lower row in the row "Ssw4<Sco" in Table 1.

On the other hand, as shown in the lower row in the row "Ssw4<Sco" in Table 1, the comparator 226b outputs the output signal Sob the signal level of which is the high level. When the output signal Sob the signal level of which is the high level is input to one input terminal of the NAND gate 224b and the output signal So0 the signal level of which is the high level is input to the other input terminal of the NAND gate 224b, the NAND gate 224b outputs the operation result signal Scab the signal level of which is the low level to the gate G of the transistor 223g, as shown in the lower row in the row "Ssw4<Sco" in Table 1.

As a result, as shown in the lower row in the row "Ssw4<Sco" in Table 1, the transistor 223f is controlled to the OFF state and the transistor 223g is controlled to the ON state. Thus, when the IGBT 211a arranged in the semiconductor element 21u is in the OFF state, the constant current supply unit 223uA supplies the IGBT 211a with constant current from the transistor 223g that has a smaller current amount of constant current between the transistors 223f and 223g. By way of this, the constant current supply unit 223uA causes the IGBT 211a to switch to the ON state with low drive capability.

In contrast, when the IGBT 211a is in the ON state, the constant current supply unit 223uA drives the IGBT 211a to maintain the ON state by supplying constant current from the transistor 223g to the IGBT 211a.

As described above, the gate drive circuit 22A and the intelligent power module 2A are capable of changing drive capability to drive the IGBTs 201a arranged in the semiconductor elements 20u, 20v, and 20w and the IGBTs 211a arranged in the semiconductor elements 21u, 21v, and 21w only by connecting the Zener diodes 6uH, 6vH, 6wH, 6uL, 6vL, and 6wL having predetermined Zener voltages to the switching signal input terminals Tsw1, Tsw2, Tsw3, Tsw4, Tsw5, and Tsw6, respectively.

As described in the foregoing, the gate drive circuit 22A as a drive circuit of switching elements according to the present embodiment, in order to cause the IGBTs 201a and 211a of the semiconductor elements 20u to 21w to switch to the ON state according to the signal levels of the input signals SinUH to Sin WL input from the control device 3, includes the constant current supply units 221uA to 223wA configured to supply constant currents to the gates G of the IGBTs 201a and 211a, the switching signal input terminals Tsw1 to Tsw6 to which the switching signals Ssw1 to Ssw6 for switching the drive capabilities of the constant current supply units 221uA to 223wA causing the IGBTs 201a and 211a to operate are input, the signal level determination units 227uA, 227vA, 227wA, 226uA, 226vA, and 226wA configured to determine the signal levels of the switching signals Ssw1 to Ssw6, and the drive capability switching units 222uA to 224wA configured to change current amounts of constant currents output from the constant current supply units 221uA to 223wA, based on determination results in the signal level determination units 227uA, 227vA, 227wA, 226uA, 226vA, and 226wA and the signal levels of the input signals SinUH to Sin WL and thereby switch the drive capabilities of constant current supply units 221uA to 223wA, respectively.

By way of this, the gate drive circuit 22A is capable of selecting a drive capability to drive the switching elements in a simple method.

The intelligent power module 2A according to the present embodiment includes the IGBTs 201a and 211a and the gate drive circuit 22A.

By way of this, the intelligent power module 2A is capable of selecting a drive capability to drive the switching elements in a simple method.

(Variation)

Although, in the present embodiment, in each of the constant current supply units 221uA to 223wA arranged in the gate drive circuit 22A, current amounts of constant currents supplied to an IGBT 201a or 211a from the transistors 223f and 223g are different from each other, the current amounts of the constant currents may be the same. In this case, when the signal level of the output signal Soa input from the comparator 226a arranged in each of the signal level determination units 227uA, 227vA, 227wA, 226uA, 226vA, 226wA is the high level and the signal level of the output signal Sob output from the comparator 226b arranged in the signal level determination unit is the low level, a corresponding one of the drive capability switching units 222uA to 224wA controls both transistors 223f and 223g to the ON state. On the other hand, when the signal level of the output signal Soa input from the comparator 226a is the low level and the signal level of the output signal Sob output from the comparator 226b is the high level, the corresponding one of the drive capability switching units 222uA to 224wA controls one of the transistors 223f and 223g to the ON state and controls the other to the OFF state.

When both transistors 223f and 223g are in the ON state, the constant current supply unit is capable of supplying the IGBT 201a or 211a with a double amount of constant current compared with a case where one of the transistors 223f and 223g is in the ON state. By way of this, the gate drive circuit 22A and the intelligent power module 2A are capable of changing drive capability to drive the IGBTs 201a and 211a only by connecting the Zener diodes 6uH to 6wL having predetermined Zener voltages to the switching signal input terminals Tsw1 to Tsw6, respectively.

Second Embodiment

A drive circuit of a switching element and an intelligent power module according to a second embodiment of the present invention will be described using FIG. 3. The drive circuit of a switching element and the intelligent power module according to the present embodiment has a feature that a constant current supply unit includes three transistors. In the following description of the drive circuit of switching elements and the intelligent power module according to the present embodiment, constituent elements that achieve the same effects and the same functions as those of the constituent elements in the gate drive circuit 22A and the intelligent power module 2A serving as the drive circuit of switching elements according to the above-described first embodiment will be denoted by the same reference numerals and description thereof will be omitted (Configuration of Intelligent Power Module)

Since an overall configuration of an intelligent power module 2B according to the present embodiment is the same as that of the intelligent power module 2A according to the above-described first embodiment, an illustration and description thereof will be omitted. In the following description of the intelligent power module 2B, FIG. 1 will be referred to as needed.

(Configuration of Drive Circuit of Switching Element)

Next, a schematic configuration of a gate drive circuit 22B serving as the drive circuit of switching elements according to the present embodiment will be described using FIG. 3. Constant current supply units corresponding to respective ones of a U-phase, a V-phase, and a W-phase of an upper arm and a U-phase, a V-phase, and a W-phase of a lower arm arranged in the gate drive circuit 22B have the same configuration as one another. Thus, the configurations of the constant current supply units will be described using a constant current supply unit 223uB (corresponding to the constant current supply unit 223uA in the above-described first embodiment) corresponding to the U-phase of the lower arm as an example. Drive capability switching units corresponding to respective ones of the U-phase, the V-phase, and the W-phase of the upper arm and the U-phase, the V-phase, and the W-phase of the lower arm arranged in the gate drive circuit 22B have the same configuration as one another. Thus, the configurations of the drive capability switching units will be described using a drive capability switching unit 224uB (corresponding to the drive capability switching unit 224uA in the above-described first embodiment) corresponding to the U-phase of the lower arm as an example. Signal level determination units corresponding to respective ones of the U-phase, the V-phase, and the W-phase of the upper arm and the U-phase, the V-phase, and the W-phase of the lower arm arranged in the gate drive circuit 22B have the same configuration as one another. Thus, the configurations of the signal level determination units will be described using a signal level determination unit 226uB (corresponding to the signal level determination unit 226uA in the above-described first embodiment) corresponding to the U-phase of the lower arm as an example.

Figure 3:
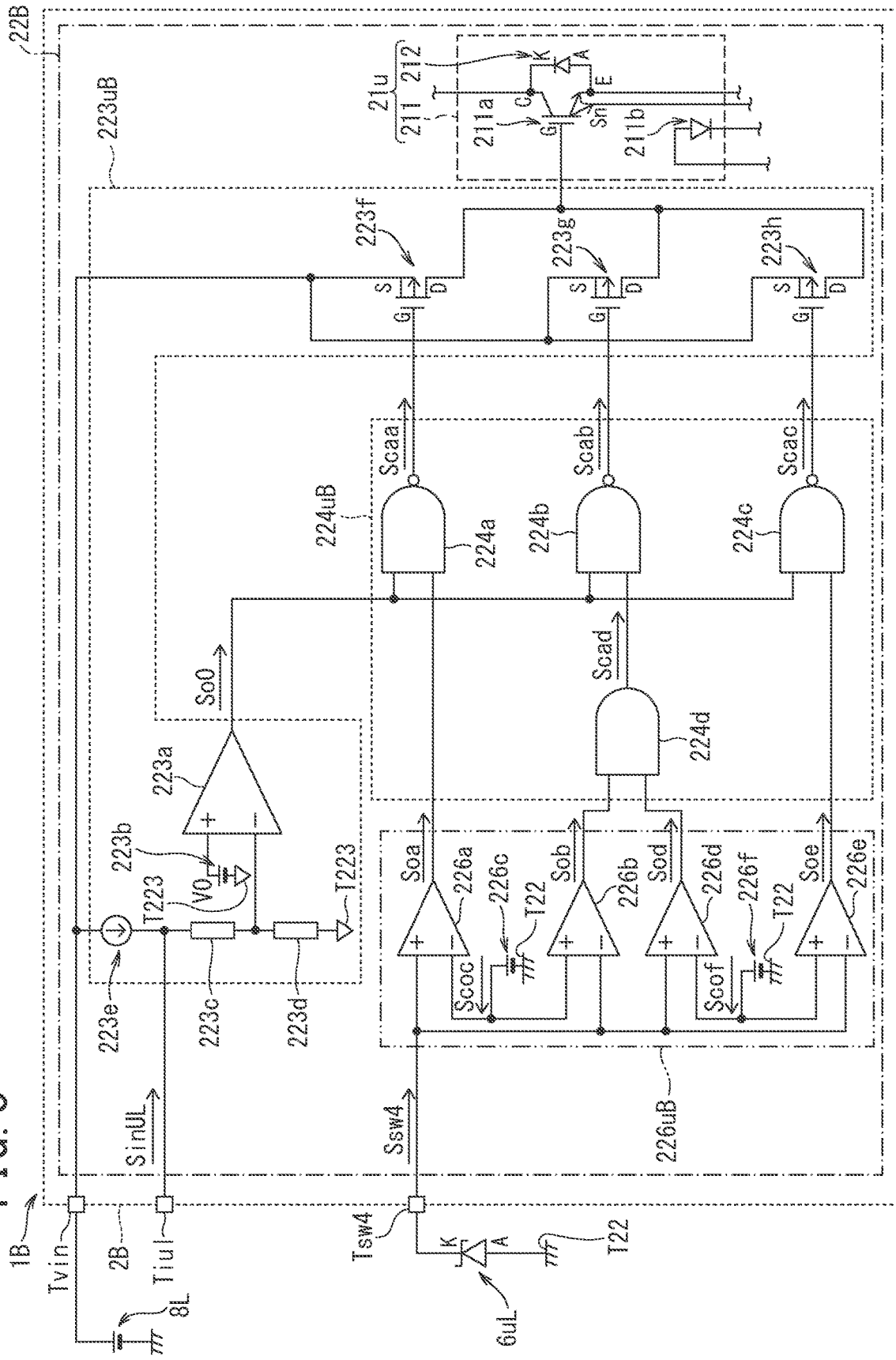
FIG. 3 is a circuit block diagram illustrating an example of a gate drive circuit serving as a drive circuit of a switching element according to a second embodiment of the present invention.

FIG. 3 is a circuit block diagram illustrative of a schematic configuration of the gate drive circuit 22B. In FIG. 3, among the constituent components arranged in the gate drive circuit 22B, the constant current supply unit 223uB, the signal level determination unit 226uB, and the drive capability switching unit 224uB are illustrated. In addition, in FIG. 3, to facilitate understanding, a semiconductor element 21u including an IGBT 211a to which the constant current supply unit 223uB supplies current, a Zener diode 6uL connected to a switching signal input terminal Tsw4, and a power source 8L connected to a power source terminal Tvin are also illustrated. Note that, since protection units that are arranged in the gate drive circuit 22B and correspond to the U-phases, the V-phases, and the W-phases of the respective ones of the upper arm and the lower arm have the same configurations and function in the same manner as the protection units 225uA, 225vA, 225wA, and 225 arranged in the gate drive circuit 22A according to the above-described first embodiment, an illustration and a description thereof in FIG. 3 will be omitted.

As illustrated in FIG. 3, the constant current supply unit 223uB includes a plurality of (three in the present embodiment) transistors 223f, 223g, and 223h configured to supply constant current to the gate G of the IGBT 211a arranged in the semiconductor element 21u. The transistors 223f, 223g, and 223h are respectively formed by, for example, P-type MOSFETs. The source S of the transistor 223f and the sources S of the respective ones of the transistor 223g and the transistor 223h are connected to the power source terminal Tvin. The drains D of the respective ones of the transistors 223f, 223g, and 223h are connected to the gate G of the IGBT 211a arranged in the semiconductor element 21u. The gates G of the respective ones of the transistors 223f, 223g, and 223h are connected to the drive capability switching unit 224uB.

Current amounts of constant currents that the transistors 223f, 223g, and 223h (an example of at least two transistors among a plurality of transistors) respectively supplies to the gate G of the IGBT 211a arranged in the semiconductor element 21u are different from one another. For example, the transistor 223f has a larger transistor size than the transistors 223g and 223h. The transistor 223g has a larger transistor size than the transistor 223h. By way of this, the current amount of the constant current from the transistor 223f is larger than the current amounts of the constant currents from the respective ones of the transistors 223g and 223h. In addition, the current amount of the constant current from the transistor 223g is larger than the current amount of the constant current from the transistor 223h.

Although details will be described later, in the case where the transistor 223f is selected as a transistor to supply constant current to the IGBT 211a arranged in the semiconductor element 21u, the constant current supply unit 223uB is capable of causing the IGBT 211a to switch to the ON state with higher drive capability than a case where the transistor 223g or 223h is selected. In addition, in the case where the transistor 223g is selected as a transistor to supply constant current to the IGBT 211a arranged in the semiconductor element 21u, the constant current supply unit 223uB is capable of causing the IGBT 211a to switch to the ON state with higher drive capability than a case where the transistor 223h is selected. Further, in the case where the transistor 223h is selected as a transistor to supply constant current to the IGBT 211a arranged in the semiconductor element 21u, the constant current supply unit 223uB is capable of causing the IGBT 211a to switch to the ON state with the lowest drive capability. As described above, the constant current supply unit 223uB is capable of, by changing a transistor to be caused to operate among the transistors 223f, 223g, and 223h, switching drive capability to drive the IGBT 211a.

As illustrated in FIG. 3, the signal level determination unit 226uB includes a plurality of (four in the present embodiment) comparators 226a, 226b, 226d, and 226e configured to compare a comparison signal set to a predetermined signal level with a switching signal Ssw4. The comparators 226a and 226b compare a comparison signal Scoc and the switching signal Ssw4 with each other, and the comparators 226d and 226e compare a comparison signal Scof and the switching signal Ssw4 with each other. The signal level determination unit 226uB includes a voltage generation unit 226c configured to generate voltage of the comparison signal Scoc and a voltage generation unit 226f configured to generate voltage of the comparison signal Scof. The comparators 226a, 226b, 226d, and 226e are respectively formed by, for example, operational amplifiers. The voltage generation units 226c and 226f are respectively formed by, for example, constant voltage sources.

The non-inverting input terminal (+) of the comparator 226a is connected to the switching signal input terminal Tsw4. The inverting input terminal (−) of the comparator 226a is connected to the positive electrode side of the voltage generation unit 226c. The output terminal of the comparator 226a is connected to the drive capability switching unit 224uB. The non-inverting input terminal (+) of the comparator 226b is connected to the positive electrode side of the voltage generation unit 226c. The inverting input terminal (−) of the comparator 226b is connected to the switching signal input terminal Tsw4. The output terminal of the comparator 226b is connected to the drive capability switching unit 224uB.

The non-inverting input terminal (+) of the comparator 226d is connected to the switching signal input terminal Tsw4. The inverting input terminal (−) of the comparator 226d is connected to the positive electrode side of the voltage generation unit 226f. The output terminal of the comparator 226d is connected to the drive capability switching unit 224uB. The non-inverting input terminal (+) of the comparator 226e is connected to the positive electrode side of the voltage generation unit 226f. The inverting input terminal (−) of the comparator 226e is connected to the switching signal input terminal Tsw4. The output terminal of the comparator 226e is connected to the drive capability switching unit 224uB.

As described above, the comparator 226a and the comparator 226b have a relationship in which input destinations are reversed to each other. Thus, the comparator 226a and the comparator 226b (an example of at least two comparators among a plurality of comparators) output signals the signal levels of which are inverted to each other to the drive capability switching unit 224uB. In addition, the comparator 226d and the comparator 226e have a relationship in which input destinations are reversed to each other. Thus, the comparator 226d and the comparator 226e (an example of at least two comparators among a plurality of comparators) output output signals the signal levels of which are inverted to each other to the drive capability switching unit 224uB.

The negative electrode side of the voltage generation unit 226c is connected to the reference potential terminal T22. The voltage generation unit 226c is configured to generate voltage of the comparison signal Scoc that serves as a reference for comparison in the comparators 226a and 226b. The negative electrode side of the voltage generation unit 226f is connected to the reference potential terminal T22. The voltage generation unit 226f is configured to generate voltage of the comparison signal Scof that serves as a reference for comparison in the comparators 226d and 226e. The voltage that the voltage generation unit 226c generates is set to be, for example, higher than the voltage that the voltage generation unit 226f generates. Therefore, the signal level of the comparison signal Scoc is higher than the signal level of the comparison signal Scof.

The Zener diode 6uL that has a Zener voltage causing the signal level of the switching signal Ssw4 to be higher than the signal level of the comparison signal Scoc, a Zener voltage causing the signal level of the switching signal Ssw4 to be lower than the comparison signal Scoc and higher than the comparison signal Scof, or a Zener voltage causing the signal level of the switching signal Ssw4 to be lower than the signal level of the comparison signal Scof is connected to the switching signal input terminal Tsw4. In the present embodiment, the voltage levels of voltages that the voltage generation units 226c and 226f generate are set in advance. Thus, the Zener diode 6uL that has a Zener voltage having a voltage level different from the voltage levels of voltages that the voltage generation units 226c and 226f generate is connected to the switching signal input terminal Tsw4 in such a way that the drive capability of all the constant current supply units including the constant current supply unit 223uB that are included in the gate drive circuit 22B coincides with a desired drive capability of a user of the intelligent power module 2B. The intelligent power module 2B is configured such that the user of the intelligent power module 2B can connect the Zener diode 6uL to the switching signal input terminal Tsw4.

When a Zener diode 6uL having a Zener voltage higher than the voltages generated by the voltage generation units 226c and 226f is connected to the switching signal input terminal Tsw4, the signal level of the switching signal Ssw4 becomes higher than the signal levels of the respective ones of the comparison signals Scoc and Scof. Therefore, in this case, the comparator 226a outputs an output signal Soa the signal level of which is the high level to the drive capability switching unit 224uB, and the comparator 226b outputs an output signal Sob the signal level of which is the low level to the drive capability switching unit 224uB. In addition, in this case, the comparator 226d outputs an output signal Sod the signal level of which is the high level to the drive capability switching unit 224uB, and the comparator 226e outputs an output signal Soe the signal level of which is the low level to the drive capability switching unit 224uB.

Further, when a Zener diode 6uL having a Zener voltage lower than the voltage generated by the voltage generation unit 226c and higher than the voltage generated by the voltage generation unit 226f is connected to the switching signal input terminal Tsw4, the signal level of the switching signal Ssw4 becomes lower than the signal level of the comparison signal Scoc and higher than the signal level of the comparison signal Scof. Therefore, in this case, the comparator 226a outputs the output signal Soa the signal level of which is the low level to the drive capability switching unit 224uB, and the comparator 226b outputs the output signal Sob the signal level of which is the high level to the drive capability switching unit 224uB. Further, in this case, the comparator 226d outputs the output signal Sod the signal level of which is the high level to the drive capability switching unit 224uB, and the comparator 226e outputs the output signal Soe the signal level of which is the low level to the drive capability switching unit 224uB.

When a Zener diode 6uL having a Zener voltage lower than the voltages generated by the voltage generation units 226c and 226f is connected to the switching signal input terminal Tsw4, the signal level of the switching signal Ssw4 becomes lower than the signal levels of the respective ones of the comparison signals Scoc and Scof. Therefore, in this case, the comparator 226a outputs the output signal Soa the signal level of which is the low level to the drive capability switching unit 224uB, and the comparator 226b outputs the output signal Sob the signal level of which is the high level to the drive capability switching unit 224uB. In addition, in this case, the comparator 226d outputs the output signal Sod the signal level of which is the low level to the drive capability switching unit 224uB, and the comparator 226e outputs the output signal Soe the signal level of which is the high level to the drive capability switching unit 224uB.

As illustrated in FIG. 3, the drive capability switching unit 224uB includes a logical AND (AND) gate 224d that performs a logical operation on the signal level of the output signal Sob of the comparator 226b and the signal level of the output signal Sod of the comparator 226d. The drive capability switching unit 224uB includes a negative AND (NAND) gate 224a (an example of a first operation unit) that performs a logical operation on the signal level of the output signal Soa of the comparator 226a (an example of one of two comparators) and the signal level of an output signal So0 (an example of a signal based on an input signal) of a comparator 223a. In addition, the drive capability switching unit 224uB includes a negative AND (NAND) gate 224b (an example of a second operation unit) that performs a logical operation on the signal level of an operation result signal Scad that the AND gate 224d outputs and the signal level of the output signal So0. In this configuration, the comparator 226*b* is equivalent to an example of the other of the two comparators. Thus, the operation result signal Scad that is obtained by performing a logical operation using the output signal Sob of the comparator 226*b* is equivalent to an example of a signal based on the output signal Sob of the comparator 226*b*. Further, the drive capability switching unit 224*u*B includes a negative AND (NAND) gate 224*c* that performs a logical operation on the signal level of the output signal Soe of the comparator 226*e* and the signal level of the output signal So0 of the comparator 223*a*.

One input terminal of the NAND gate 224*a* is connected to the output terminal of the comparator 223*a* arranged in the constant current supply unit 223*u*B. The other input terminal of the NAND gate 224*a* is connected to the output terminal of the comparator 226*a* arranged in the signal level determination unit 226*u*B. The output terminal of the NAND gate 224*a* is connected to the gate G of the transistor 223*f* arranged in the constant current supply unit 223*u*B. Thus, the NAND gate 224*a* outputs an operation result signal Scaa to the gate G (an example of a control signal input terminal of one of two transistors) of the transistor 223*f*.

One input terminal of the NAND gate 224*b* is connected to the output terminal of the comparator 223*a* arranged in the constant current supply unit 223*u*B. The other input terminal of the NAND gate 224*b* is connected to the output terminal of the AND gate 224*d*. The output terminal of the NAND gate 224*b* is connected to the gate G of the transistor 223*g* arranged in the constant current supply unit 223*u*B. Thus, the NAND gate 224*b* outputs an operation result signal Scab to the gate G (an example of a control signal input terminal of the other of the two transistors) of the transistor 223*g*.

One input terminal of the NAND gate 224*c* is connected to the output terminal of the comparator 223*a* arranged in the constant current supply unit 223*u*B. The other input terminal of the NAND gate 224*c* is connected to the output terminal of the comparator 226*e* arranged in the signal level determination unit 226*u*B. The output terminal of the NAND gate 224*c* is connected to the gate G of the transistor 223*h* arranged in the constant current supply unit 223*u*B. Thus, the NAND gate 224*c* outputs an operation result signal Scac to the gate G of the transistor 223*h*.

To the other input terminals of the respective ones of the NAND gates 224*a*, 224*b*, and 224*c*, the output signal So0 is input. Thus, the signal levels of the respective ones of the operation result signals Scaa, Scab, and Scac depend on the signal levels of signals input to one input terminals of the respective ones of the NAND gates 224*a*, 224*b*, and 224*c*, respectively. Although details will be described later, depending on a high/low relationship among the signal level of the switching signal Ssw4, the signal level of the comparison signal Scoc, and the signal level of the comparison signal Scof, only one of the operation result signals Scaa, Scab, and Scac becomes the low level. By way of this, when the transistor 223*f* switches to the ON state, the transistor 223*g* and the transistor 223*h* maintain the OFF state. In addition, when the transistor 223*g* switches to the ON state, the transistor 223*f* and the transistor 223*h* maintain the OFF state. Further, when the transistor 223*h* switches to the ON state, the transistor 223*f* and the transistor 223*g* maintain the OFF state.

The output signal So0 output from the comparator 223*a* is a signal based on an input signal SinUL. Thus, the NAND gates 224*a*, 224*b*, and 224*c* that perform a logical operation using the signal level of the output signal So0 are configured to perform a logical operation, based on the signal level of the input signal SinUL. Therefore, the drive capability switching unit 224*u*B controls at least one of the transistors 223*f* and 223*g* to the ON state, based on the determination results (i.e., the signal levels of the output signals Soa, Sob, Sod, and Soe) in the signal level determination unit 226*u*B and the signal level of the input signal SinUL. In the present embodiment, the drive capability switching unit 224*u*B controls one of the transistors 223*f*, 223*g*, and 223*h* to the ON state.

Note that, in the drive capability switching units for driving the semiconductor elements 20*u*, 20*v*, and 20*w* that constitute the upper arm portion (corresponding to the drive capability switching units 222*u*A, 222*v*A, and 222*w*A in the above-described first embodiment), voltage level shift circuits may be connected to the input terminals of the NAND gates 224*a*, 224*b*, and 224*c* and the AND gate 224*d*. The output signals So0, Soa, Sob, Sod, and Soe are input to the voltage level shift circuits. By way of this, the voltage levels of the output signals So0, Soa, Sob, Sod, and Soe are converted to voltage levels matching the upper arm portion and subsequently are logically operated by the NAND gates 224*a*, 224*b*, and 224*c* and the AND gate 224*d*.

Further, in the constant current supply units for driving the semiconductor elements 20*u*, 20*v*, and 20*w* that constitute the upper arm portion (corresponding to the constant current supply units 221*u*A, 221*v*A, and 221*w*A in the above-described first embodiment), the sources S of the respective ones of the transistors 223*f*, 223*g*, and 223*h* are individually connected to the power source terminals of the respective ones of the U-phase, the V-phase, and the W-phase of the upper arm portion.

(Operation of Drive Circuit of Switching Element)

Next, operation of the gate drive circuit 22B serving as the drive circuit of switching elements according to the present embodiment will be described using FIG. 3. The constant current supply units corresponding to the respective ones of the U-phase, the V-phase, and the W-phase of the upper arm and the U-phase, the V-phase, and the W-phase of the lower arm arranged in the gate drive circuit 22B operate in the same manner as one another. Thus, operation of the constant current supply units will be described using the constant current supply unit 223*u*B corresponding to the U-phase of the lower arm as an example. The drive capability switching units corresponding to the respective ones of the U-phase, the V-phase, and the W-phase of the upper arm and the U-phase, the V-phase, and the W-phase of the lower arm arranged in the gate drive circuit 22B operate in the same manner as one another. Thus, operation of the drive capability switching units will be described using the drive capability switching unit 224*u*B corresponding to the U-phase of the lower arm as an example. The signal level determination units corresponding to the respective ones of the U-phase, the V-phase, and the W-phase of the upper arm and the U-phase, the V-phase, and the W-phase of the lower arm arranged in the gate drive circuit 22B operate in the same manner as one another. Thus, operation of the signal level determination units will be described using the signal level determination unit 226*u*B corresponding to the U-phase of the lower arm as an example.

Table 2 is a truth table of the transistors 223*f*, 223*g*, and 223*h* arranged in the constant current supply unit 223*u*B. "SinUL" in Table 2 indicates the input signal SinUL input to the constant current supply unit 223*u*B from the control device 3. "So0" in Table 2 indicates the output signal So0 that the comparator 223*a* arranged in the constant current supply unit 223*u*B outputs. "Soa" in Table 2 indicates the output signal Soa that the comparator 226*a* arranged in the signal level determination unit 226*u*B outputs. "Sob" in Table 2 indicates the output signal Sob that the comparator 226b arranged in the signal level determination unit 226uB outputs. "Sod" in Table 2 indicates the output signal Sod that the comparator 226d arranged in the signal level determination unit 226uB outputs. "Soe" in Table 2 indicates the output signal Soe that the comparator 226e arranged in the signal level determination unit 226uB outputs.

"Scad" in Table 2 indicates the operation result signal Scad that the AND gate 224d arranged in the drive capability switching unit 224uB outputs. "Scaa" in Table 2 indicates the operation result signal Scaa that the NAND gate 224a arranged in the drive capability switching unit 224uB outputs. "Scab" in Table 2 indicates the operation result signal Scab that the NAND gate 224b arranged in the drive capability switching unit 224uB outputs. "Scac" in Table 2 indicates the operation result signal Scac that the NAND gate 224c arranged in the drive capability switching unit 224uB outputs. "Qf" in Table 2 indicates the transistor 223f arranged in the constant current supply unit 223uB. "Qg" in Table 2 indicates the transistor 223g arranged in the constant current supply unit 223uB. "Qh" in Table 2 indicates the transistor 223h arranged in the constant current supply unit 223uB. "L" in Table 2 indicates that the signal level is the low level. "H" in Table 2 indicates that the signal level is the high level. "ON" in Table 2 indicates that the transistor is in the ON state. "OFF" in Table 2 indicates that the transistor is in the OFF state.

the IGBT 211a is in the ON state, the constant current supply unit 223uB drives the IGBT 211a to switch from the ON state to the OFF state. That is, the constant current supply unit 223uB drives the IGBT 211a to turn off.

When the input signal SinUL the signal level of which is the low level is input from the control device 3 to the constant current supply unit 223uB, the signal level of the output signal So0 output from the comparator 223a becomes the high level, as shown in the lower row in the row "Ssw4>Scoc" in Table 2.

Since the signal level of the switching signal Ssw4 is higher than the signal level of the comparison signal Scoc, the comparator 226a outputs the output signal Soa the signal level of which is the high level, as shown in the lower row in the row "Ssw4>Scoc" in Table 2. When the output signal Soa the signal level of which is the high level is input to one input terminal of the NAND gate 224a and the output signal So0 the signal level of which is the high level is input to the other input terminal of the NAND gate 224a, the NAND gate 224a outputs the operation result signal Scaa the signal level of which is the low level to the gate G of the transistor 223f, as shown in the lower row in the row "Ssw4>Scoc" in Table 2.

In addition, as shown in the lower row in the row "Ssw4>Scoc" in Table 2, the comparator 226b outputs the output signal Sob the signal level of which is the low level.

TABLE 2

| | SinUL | So0 | Soa | Sob | Sod | Soe | Scad | Scaa | Scab | Scac | Qf | Qg | Qh |
|---|---|---|---|---|---|---|---|---|---|---|---|---|---|
| Ssw4 > Scoc | H | L | H | T | H | L | H | H | H | H | OFF | OFF | OFF |
| | L | H | H | L | H | L | L | L | H | H | ON | OFF | OFF |
| Scof < Ssw4 < Scoc | H | L | L | H | H | L | H | H | H | H | OFF | OFF | OFF |
| | L | H | L | H | H | L | H | H | L | H | OFF | ON | OFF |
| Ssw4 < Scof | H | L | L | H | L | H | H | H | H | H | OFF | OFF | OFF |
| | I | H | L | H | L | H | H | H | H | L | OFF | OFF | ON |

(Case where Ssw4>Scoc)

First, operation of the gate drive circuit 22B in the case where the Zener voltage of the Zener diode 6uL is higher than the voltage generated by the voltage generation unit 226c arranged in the signal level determination unit 226uB, that is, in the case where the signal level of the switching signal Ssw4 is higher than the signal level of the comparison signal Scoc, will be described.

When the input signal SinUL the signal level of which is the high level is input from the control device 3 to the constant current supply unit 223uB, the signal level of the output signal So0 output from the comparator 223a becomes the low level, as shown in the upper row in the row "Ssw4>Scoc" in Table 2.

When the output signal So0 the signal level of which is the low level is input to the other input terminals of the NAND gates 224a, 224b, and 224c arranged in the drive capability switching unit 224uB, the NAND gates 224a, 224b, and 224c outputs, regardless of the signal levels of signals input to one input terminals thereof, the operation result signals Scaa, Scab, and Scac the signal levels of which are the high level to the gates G of the transistors 223f, 223g, and 223h arranged in the constant current supply unit 223uB, respectively. Thus, as shown in the upper row in the row "Ssw4>Scoc" in Table 2, all the transistors 223f, 223g, and 223h are controlled to the OFF state. Thus, when the IGBT 211a arranged in the semiconductor element 21u is in the OFF state, the constant current supply unit 223uB drives the IGBT 211a to maintain the OFF state. In contrast, when Since the signal level of the switching signal Ssw4 is higher than the signal level of the comparison signal Scof, the comparator 226d outputs the output signal Sod the signal level of which is the high level. By way of this, the output signal Sob the signal level of which is the low level is input to one input terminal of the AND gate 224d and the output signal Sod the signal level of which is the high level is input to the other input terminal of the AND gate 224d. Thus, as shown in the lower row in the row "Ssw4>Scoc", the AND gate 224d outputs the operation result signal Scad the signal level of which is the low level.

When the operation result signal Scad the signal level of which is the low level is input to one input terminal of the NAND gate 224b and the output signal So0 the signal level of which is the high level is input to the other input terminal of the NAND gate 224b, the NAND gate 224b outputs the operation result signal Scab the signal level of which is the high level to the gate G of the transistor 223g, as shown in the lower row in the row "Ssw4>Scoc" in Table 2.

Further, as shown in the lower row in the row "Ssw4>Scoc" in Table 2, the comparator 226e outputs the output signal Soe the signal level of which is the low level. When the output signal Soe the signal level of which is the low level is input to one input terminal of the NAND gate 224c and the output signal So0 the signal level of which is the high level is input to the other input terminal of the NAND gate 224c, the NAND gate 224c outputs the operation result signal Scac the signal level of which is the high level to the gate G of the transistor 223h, as shown in the lower row in the row "Ssw4>Scoc" in Table 2.

As a result, as shown in the lower row in the row "Ssw4>Scoc" in Table 2, the transistor 223*f* is controlled to the ON state, the transistor 223*g* is controlled to the OFF state, and the transistor 223*h* is controlled to the OFF state. Thus, when the IGBT 211*a* arranged in the semiconductor element 21*u* is in the OFF state, the constant current supply unit 223*u*B supplies the IGBT 211*a* with constant current from the transistor 223*f* that has the largest current amount of constant current among the transistors 223*f*, 223*g*, and 223*h*. By way of this, the constant current supply unit 223*u*B causes the IGBT 211*a* to switch to the ON state with high drive capability.

In contrast, when the IGBT 211*a* is in the ON state, the constant current supply unit 223*u*B drives the IGBT 211*a* to maintain the ON state by supplying constant current from the transistor 223*f* to the IGBT 211*a*.

(Case where Scof<Ssw4<Scoc)

Next, operation of the gate drive circuit 22B in the case where the Zener voltage of the Zener diode 6*u*L is lower than the voltage generated by the voltage generation unit 226*c* arranged in the signal level determination unit 226*u*B and higher than the voltage generated by the voltage generation unit 226*f* arranged in the signal level determination unit 226*u*B, that is, in the case where the signal level of the switching signal Ssw4 is lower than the signal level of the comparison signal Scoc and higher than the signal level of the comparison signal Scof, will be described.

When the input signal SinUL the signal level of which is the high level is input from the control device 3 to the constant current supply unit 223*u*B, the signal level of the output signal So0 output from the comparator 223*a* becomes the low level, as shown in the upper row in the row "Scof<Ssw4<Scoc" in Table 2.

When the output signal So0 the signal level of which is the low level is input to the other input terminals of the NAND gates 224*a*, 224*b*, and 224*c*, the NAND gates 224*a*, 224*b*, and 224*c* outputs, regardless of the signal levels of signals input to one input terminals thereof, the operation result signals Scaa, Scab, and Scac the signal levels of which are the high level to the gates G of the transistors 223*f*, 223*g*, and 223*h*, respectively. Thus, as shown in the upper row in the row "Scof<Ssw4<Scoc" in Table 2, all the transistors 223*f*, 223*g*, and 223*h* are controlled to the OFF state. Thus, when the IGBT 211*a* arranged in the semiconductor element 21*u* is in the OFF state, the constant current supply unit 223*u*B drives the IGBT 211*a* to maintain the OFF state. In contrast, when the IGBT 211*a* is in the ON state, the constant current supply unit 223*u*B drives the IGBT 211*a* to switch from the ON state to the OFF state. That is, the constant current supply unit 223*u*B drives the IGBT 211*a* to turn off.

When the input signal SinUL the signal level of which is the low level is input from the control device 3 to the constant current supply unit 223*u*B, the signal level of the output signal So0 output from the comparator 223*a* becomes the high level, as shown in the lower row in the row "Scof<Ssw4<Scoc" in Table 2.

Since the signal level of the switching signal Ssw4 is lower than the signal level of the comparison signal Scoc, the comparator 226*a* outputs the output signal Soa the signal level of which is the low level, as shown in the lower row in the row "Scof<Ssw4<Scoc" in Table 2. When the output signal Soa the signal level of which is the low level is input to one input terminal of the NAND gate 224*a* and the output signal So0 the signal level of which is the high level is input to the other input terminal of the NAND gate 224*a*, the NAND gate 224*a* outputs the operation result signal Scaa the signal level of which is the high level to the gate G of the transistor 223*f*, as shown in the lower row in the row "Scof<Ssw4<Scoc" in Table 2.

In addition, as shown in the lower row in the row "Scof<Ssw4<Scoc" in Table 2, the comparator 226*b* outputs the output signal Sob the signal level of which is the high level. Since the signal level of the switching signal Ssw4 is higher than the signal level of the comparison signal Scof, the comparator 226*d* outputs the output signal Sod the signal level of which is the high level. By way of this, the output signal Sob the signal level of which is the high level is input to one input terminal of the AND gate 224*d* and the output signal Sod the signal level of which is the high level is input to the other input terminal of the AND gate 224*d*. Thus, as shown in the lower row in the row "Scof<Ssw4<Scoc", the AND gate 224*d* outputs the operation result signal Scad the signal level of which is the high level.

When the operation result signal Scad the signal level of which is the high level is input to one input terminal of the NAND gate 224*b* and the output signal So0 the signal level of which is the high level is input to the other input terminal of the NAND gate 224*b*, the NAND gate 224*b* outputs the operation result signal Scab the signal level of which is the low level to the gate G of the transistor 223*g*, as shown in the lower row in the row "Scof<Ssw4<Scoc" in Table 2.

In addition, as shown in the lower row in the row "Scof<Ssw4<Scoc" in Table 2, the comparator 226*e* outputs the output signal Soe the signal level of which is the low level. When the output signal Soe the signal level of which is the low level is input to one input terminal of the NAND gate 224*c* and the output signal So0 the signal level of which is the high level is input to the other input terminal of the NAND gate 224*c*, the NAND gate 224*c* outputs the operation result signal Scac the signal level of which is the high level to the gate G of the transistor 223*h*, as shown in the lower row in the row "Scof<Ssw4<Scoc" in Table 2.

As a result, as shown in the lower row in the row "Scof<Ssw4<Scoc" in Table 2, the transistor 223*f* is controlled to the OFF state, the transistor 223*g* is controlled to the ON state, and the transistor 223*h* is controlled to the OFF state. Thus, when the IGBT 211*a* arranged in the semiconductor element 21*u* is in the OFF state, the constant current supply unit 223*u*B supplies the IGBT 211*a* with constant current from the transistor 223*g* that has a second-largest current amount of constant current among the transistors 223*f*, 223*g*, and 223*h*. By way of this, the constant current supply unit 223*u*B causes the IGBT 211*a* to switch to the ON state with the second-highest drive capability.

In contrast, when the IGBT 211*a* is in the ON state, the constant current supply unit 223*u*B drives the IGBT 211*a* to maintain the ON state by supplying constant current from the transistor 223*g* to the IGBT 211*a*.

(Case where Ssw4<Scof)

Next, operation of the gate drive circuit 22B in the case where the Zener voltage of the Zener diode 6*u*L is lower than the voltages generated by the respective ones of the voltage generation units 226*c* and 226*f* arranged in the signal level determination unit 226*u*B, that is, in the case where the signal level of the switching signal Ssw4 is lower than the signal levels of the respective ones of the comparison signals Scoc and Scof, will be described.

When the input signal SinUL the signal level of which is the high level is input from the control device 3 to the constant current supply unit 223*u*B, the signal level of the output signal So0 output from the comparator 223*a* becomes the low level, as shown in the upper row in the row "Ssw4<Scof" in Table 2.

When the output signal So0 the signal level of which is the low level is input to the other input terminals of the NAND gates 224a, 224b, and 224c, the NAND gates 224a, 224b, and 224c outputs, regardless of the signal levels of signals input to one input terminals thereof, the operation result signals Scaa, Scab, and Scac the signal levels of which are the high level to the gates G of the transistors 223f, 223g, and 223h, respectively. Thus, as shown in the upper row in the row "Ssw4<Scof" in Table 2, all the transistors 223f, 223g, and 223h are controlled to the OFF state. Thus, when the IGBT 211a arranged in the semiconductor element 21u is in the OFF state, the constant current supply unit 223uB drives the IGBT 211a to maintain the OFF state. In contrast, when the IGBT 211a is in the ON state, the constant current supply unit 223uB drives the IGBT 211a to switch from the ON state to the OFF state. That is, the constant current supply unit 223uB drives the IGBT 211a to turn off.

When the input signal SinUL the signal level of which is the low level is input from the control device 3 to the constant current supply unit 223uB, the signal level of the output signal So0 output from the comparator 223a becomes the high level, as shown in the lower row in the row "Ssw4<Scof" in Table 2.

Since the signal level of the switching signal Ssw4 is lower than the signal level of the comparison signal Scoc, the comparator 226a outputs the output signal Soa the signal level of which is the low level, as shown in the lower row in the row "Ssw4<Scof" in Table 2. When the output signal Soa the signal level of which is the low level is input to one input terminal of the NAND gate 224a and the output signal So0 the signal level of which is the high level is input to the other input terminal of the NAND gate 224a, the NAND gate 224a outputs the operation result signal Scaa the signal level of which is the high level to the gate G of the transistor 223f, as shown in the lower row in the row "Ssw4<Scof" in Table 2.

In addition, as shown in the lower row in the row "Ssw4<Scof" in Table 2, the comparator 226b outputs the output signal Sob the signal level of which is the high level. Since the signal level of the switching signal Ssw4 is lower than the signal level of the comparison signal Scof, the comparator 226d outputs the output signal Sod the signal level of which is the low level. By way of this, the output signal Sob the signal level of which is the high level is input to one input terminal of the AND gate 224d and the output signal Sod the signal level of which is the low level is input to the other input terminal of the AND gate 224d. Thus, as shown in the lower row in the row "Ssw4<Scof", the AND gate 224d outputs the operation result signal Scad the signal level of which is the low level.

When the operation result signal Scad the signal level of which is the low level is input to one input terminal of the NAND gate 224b and the output signal So0 the signal level of which is the high level is input to the other input terminal of the NAND gate 224b, the NAND gate 224b outputs the operation result signal Scab the signal level of which is the high level to the gate G of the transistor 223g, as shown in the lower row in the row "Ssw4<Scof" in Table 2.

Since the signal level of the switching signal Ssw4 is lower than the signal level of the comparison signal Scof, the comparator 226e outputs the output signal Soe the signal level of which is the high level, as shown in the lower row in the row "Ssw4<Scof" in Table 2. When the output signal Soe the signal level of which is the high level is input to one input terminal of the NAND gate 224c and the output signal So0 the signal level of which is the high level is input to the other input terminal of the NAND gate 224c, the NAND gate 224c outputs the operation result signal Scac the signal level of which is the low level to the gate G of the transistor 223h, as shown in the lower row in the row "Ssw4<Scof" in Table 2.

As a result, as shown in the lower row in the row "Ssw4<Scof" in Table 2, the transistor 223f is controlled to the OFF state, the transistor 223g is controlled to the OFF state, and the transistor 223h is controlled to the ON state. Thus, when the IGBT 211a arranged in the semiconductor element 21u is in the OFF state, the constant current supply unit 223uB supplies the IGBT 211a with constant current from the transistor 223h that has the smallest current amount of constant current among the transistors 223f, 223g, and 223h. By way of this configuration, the constant current supply unit 223uB causes the IGBT 211a to switch to the ON state with the lowest drive capability.

In contrast, when the IGBT 211a is in the ON state, the constant current supply unit 223uB drives the IGBT 211a to maintain the ON state by supplying constant current from the transistor 223h to the IGBT 211a.

As described above, the gate drive circuit 22B and the intelligent power module 2B are capable of changing drive capability to drive the IGBTs (corresponding to the IGBTs 201a and 211a) arranged in the semiconductor elements corresponding to the U-phase, the V-phase, and the W-phase of each of the upper arm and the lower arm only by connecting the Zener diodes (corresponding to the Zener diodes 6uH to 6wL in the above-described first embodiment) having predetermined Zener voltages to the switching signal input terminals (corresponding to the switching signal input terminals Tsw1 to Tsw6 in the above-described first embodiment) corresponding to the U-phase, the V-phase, and the W-phase of each of the upper arm and the lower arm.

As described in the foregoing, since the gate drive circuit 22B as the drive circuit of switching elements according to the present embodiment has a similar configuration to that of the gate drive circuit 22A according to the above-described first embodiment, the gate drive circuit 22B is capable of selecting a drive capability to drive the switching elements in a simple method.

The intelligent power module 2B according to the present embodiment includes the IGBTs 201a and 211a and the gate drive circuit 22B.

By way of this, the intelligent power module 2B is capable of selecting a drive capability to drive the switching elements in a simple method.

(Variation)

Although, in the present embodiment, in each of the constant current supply units 221uB to 223wB arranged in the gate drive circuit 22B, current amounts of constant currents supplied to an IGBT 211a from the transistors 223f, 223g and 223h are different from each other, the current amounts of the constant currents may be the same. In this case, when the signal level of the output signal Soa input from the comparator 226a arranged in the signal level determination unit 226uB is the high level, the signal level of the operation result signal Scad input from the AND gate 224d is the low level, and the signal level of the output signal Soe is the low level, each of the drive capability switching units 222uB to 224wB controls all the transistors 223f, 223g, and 223h to the ON state. In addition, when the signal levels of the output signals Soa and Soe input from the comparators 226a and 226e are the low level and the signal level of the operation result signal Scad is the high level, each of the drive capability switching units 222uB to 224wB controls any two of the transistors 223f, 223g, and 223h to the ON state and controls the remaining one to the OFF state.

Further, when the signal level of the output signal Soa input from the comparator 226a is the low level, the signal level of the operation result signal Scad is the low level, and the signal level of the output signal Soe input from the comparator 226e is the high level, each of the drive capability switching units 222uB to 224wB controls the transistor 223h to the ON state and controls the transistors 223f and 223g to the OFF state.

As the number of transistors in the ON state among the transistors 223f, 223g, and 223h increases, each of the constant current supply units 221uA to 223wB is capable of supply the IGBTs 201a and 211a with constant currents with larger current amounts. By way of this, the gate drive circuit 22B and the intelligent power module 2B are capable of changing drive capability to drive the IGBTs 201a and 211a only by connecting the Zener diodes 6uH to 6wL having predetermined Zener voltages to the switching signal input terminals Tsw1 to Tsw6, respectively.

The present invention is not limited to the above-described embodiments, and various modification are possible.

Although, in the above-described first embodiment and the above-described second embodiment, the signal level of each switching signal is set by connecting a Zener diode to a corresponding switching signal input terminal, the present invention is not limited to the configuration. For example, a connection point between a plurality of resistance elements connected in series between the power source terminal and the reference potential terminal may be connected to the switching signal input terminal. In this case, since voltage based on resistance division by the plurality of resistance elements is input to the switching signal input terminal, it is possible to set the signal level of the switching signal.

Although, in the above-described first embodiment and the above-described second embodiment, it is configured such that at least one of a plurality of transistors that are arranged in each constant current supply unit and supply constant currents having current amounts different from one another is controlled to the ON state, the present invention is not limited to the configuration. For example, even when a plurality of transistors supplying constant currents having current amounts different from one another coexist, one or two or more transistors may be appropriately controlled to the ON state, as in the variations of the above-described first embodiment and the above-described second embodiment. This configuration allows the drive capability of the gate drive circuit to be changed to more levels than the number of transistors arranged in each constant current supply unit.

Although, in the above-described first embodiment and the above-described second embodiment, the drive capability of the gate drive circuit is switched by a plurality of transistors, the present invention is not limited to the configuration. For example, one transistor may be arranged in each constant current supply unit and, by changing the voltage level input to the gate of the transistor according to the signal level of a switching signal, the current amount of current supplied from the transistor may be switched. In this case, the drive capability of the gate drive circuit can also be switched.

Although the intelligent power modules 2A and 2B according to the above-described first embodiment and the above-described second embodiment include IGBTs as switching elements, the present invention is not limited to the configuration. The intelligent power modules 2A and 2B may include, in place of IGBTs, either bipolar transistors or power MOS transistors as switching elements.

The technical scope of the present invention is not limited to the illustrated and described exemplary embodiments, but includes all embodiments causing an effect equivalent to the object of the present invention.

Furthermore, the technical scope of the present invention is not limited to combinations of features of the inventions defined by the claims, but can be defined by all desired combinations of specific features among all the disclosed features.

REFERENCE SIGNS LIST

1A Power conversion device
2A, 2B Intelligent power module
2U U-phase output arm
2V V-phase output arm
2W W-phase output arm
3 Control device
4 AC power unit
5 Smoothing capacitor
6uH, 6vH, 6wH, 6uL, 6vL, 6wL Zener diode
7 Motor
8L Power source
20v, 20w, 21u, 21v, 21w Semiconductor element
22A, 22B Gate drive circuit
201, 211 IGBT chip
201a, 211a IGBT
202, 212 Freewheel diode
211b Temperature detection element
221uA, 221uB, 221vA, 221vB, 221wA, 221wB Constant current supply unit
222uA, 222uB, 222vA, 222vB, 222wA, 222wB Drive capability switching unit
223a, 225e-1, 225f-1, 225g-1, 226a, 226b, 226d, 226e Comparator
223b, 225e-2, 225f-2, 225g-2, 226c, 226f Voltage generation unit
223c, 223d, 225g-3, 225h Resistance element
223e, 225c Constant current source
223f, 223g, 223h, 225b, 233h Transistor
223uA, 223uB, 223vA, 223vB, 223wA, 223wB Constant current supply unit
224a, 224b, 224c NAND gate
224d AND gate
224uA, 224uB, 224vA, 224vB, 224wA, 224wB Drive capability switching unit
225, 225uA, 225vA, 225wA Protection unit
225a Temperature detection unit
225d Alarm signal generation circuit
225e Control voltage detection circuit
225f Temperature detection circuit
225g Current detection circuit
226A, 226B Signal level determination unit
211b Temperature detection element
ALM, ALMu, ALMv, ALMw Alarm signal
Ln Negative electrode-side line
Lp Positive electrode-side line
Scaa, Scab, Scac, Scad Operation result signal
Sco, Scoc, Scof Comparison signal
SinUH, SinUL, SinVH, SinVL, SinWH, SinWL Input signal
So0, Soa, Sob, Sod, Soe Output signal
Ssw1, Ssw2, Ssw3, Ssw4, Ssw5, Ssw6 Switching signal
T22, T223 Reference potential terminal
Tiuh, Tiul, Tivh, Tivl, Tiwh, Tiwl Signal input terminal
Tn Negative electrode-side power input terminal
Tp Positive electrode-side power input terminal
Tsw1, Tsw2, Tsw3, Tsw4, Tsw5, Tsw6 Switching signal input terminal TU U-phase output terminal
TV V-phase output terminal
Tvin Power source terminal
TW W-phase output terminal
V0 Comparison voltage
VFO, VFOu, VFOv, VFOw Alarm signal output terminal

The invention claimed is:

1. A drive circuit for a switching element comprising:
a constant current supply to receive an input signal from outside of the drive circuit and to supply constant current to a control signal input terminal of the switching element according to a signal level of the input signal;
a switching signal input terminal to receive a switching signal;
a signal level determiner, in communication with the switching signal input terminal, to determine a signal level of the switching signal by comparing the switching signal with a comparison signal; and
a drive capability switch, in communication with the signal level determiner and the constant current supply, to switch drive capability of the constant current supply by changing a current amount of the constant current supplied by the constant current supply based on a determination result in the signal level determiner and the signal level of the input signal, wherein
the switching element switches to an ON state according to the current amount of the constant current supplied to the switching element by the constant current supply.

2. The drive circuit for the switching element according to claim 1, wherein
the constant current supply includes a plurality of transistors configured to supply the control signal input terminal with the constant current.

3. The drive circuit for the switching element according to claim 2, wherein the drive capability switch controls, based on the determination result and a signal level of the input signal, at least one of the plurality of transistors to the ON state.

4. The drive circuit for the switching element according to claim 3, wherein
the signal level determiner includes a plurality of comparators configured to compare a comparison signal, the comparison signal being set to a predetermined signal level, with the switching signal, and
at least two comparators among the plurality of comparators to output output signals having signal levels inverted to each other to the drive capability switch.

5. The drive circuit for the switching element according to claim 4, wherein
the drive capability switch includes a first operation unit configured to perform a logical operation on a signal level of the output signal of one of the two comparators and a signal level of a signal based on the input signal and a second operation unit configured to perform a logical operation on a signal level of the output signal of the other of the two comparators or a signal level of a signal based on the output signal and the signal level of a signal based on the input signal,
the first operation unit outputs an operation result signal to a control signal input terminal of one of the two transistors, and
the second operation unit outputs an operation result signal to a control signal input terminal of the other of the two transistors.

6. The drive circuit for the switching element according to claim 1 comprising:
a temperature detection unit configured to detect temperature of the switching element;
a current detection unit configured to detect current flowing through the switching element;
a control voltage detection unit configured to detect control voltage to control the constant current supply; and
an alarm signal generation unit configured to generate an alarm signal notifying that at least one of the temperature detection unit, the current detection unit, and the control voltage detection unit detected an abnormality.

7. An intelligent power module comprising:
the drive circuit for the switching element according to claim 6; and the switching element.

8. An intelligent power module comprising:
the drive circuit for the switching element according to claim 1; and the switching element.

* * * * *